(12) United States Patent
Han et al.

(10) Patent No.: US 11,929,189 B2
(45) Date of Patent: Mar. 12, 2024

(54) FILTERING CABLE

(71) Applicant: Yunan Han, Beijing (CN)

(72) Inventors: Yunan Han, Beijig (CN); Xueying Han, Beijing (CN)

(73) Assignee: Yunan Han, Beijing (CN)

( * ) Notice: Subject to any disclaimer, the term of this patent is extended or adjusted under 35 U.S.C. 154(b) by 291 days.

(21) Appl. No.: 16/954,886

(22) PCT Filed: Jun. 19, 2019

(86) PCT No.: PCT/CN2019/091830
§ 371 (c)(1),
(2) Date: Feb. 21, 2022

(87) PCT Pub. No.: WO2020/252678
PCT Pub. Date: Dec. 24, 2020

(65) Prior Publication Data
US 2022/0199292 A1    Jun. 23, 2022

(51) Int. Cl.
*H01B 11/10* (2006.01)
*H05K 1/02* (2006.01)
*H05K 1/16* (2006.01)
*H05K 3/06* (2006.01)
*H05K 3/28* (2006.01)
*H05K 3/46* (2006.01)

(52) U.S. Cl.
CPC ............ *H01B 11/10* (2013.01); *H05K 1/162* (2013.01); *H05K 1/165* (2013.01); *H05K 3/4673* (2013.01); *H05K 2201/037* (2013.01); *H05K 2201/10356* (2013.01)

(58) Field of Classification Search
CPC ...... H05K 1/162; H05K 1/165; H05K 1/0221; H05K 1/167; H05K 3/4673; H05K 3/06; H05K 3/285; H05K 3/4608; H05K 2201/037; H05K 2201/10356; H05K 2201/0116; H05K 2201/09881; H05K 2201/09263; H05K 2203/083; H05K 2203/1194; H01B 11/10
See application file for complete search history.

(56) References Cited

U.S. PATENT DOCUMENTS 3,312,774 A * 4/1967 Drinko .................. H01B 3/004
   174/121 R
7,923,641 B2 * 4/2011 Smith ................ H01B 11/1008
   174/113 R
9,024,193 B2 * 5/2015 Nordin ...................... B32B 7/12
   174/113 C (Continued)

*Primary Examiner* — Hoa C Nguyen
*Assistant Examiner* — Amol H Patel
(74) *Attorney, Agent, or Firm* — Bay State IP, LLC

(57) ABSTRACT

The present application discloses a filtering cable, which solves the problem that the cable in the related art cannot ensure a simple and reasonable structural design while having good filter performance. One or several core wires and N defective conductor layers surrounding the core wires are sequentially provided from inside to outside in the cross section in the radial direction of the filtering cable; wherein the defective conductor layer has an etching pattern; the etching pattern is distributed in the axial direction of the filtering cable; the etching pattern is used to make the filtering cable equivalent to a preset filter circuit to filter the signal transmitted in the filtering cable.

12 Claims, 13 Drawing Sheets

(56) References Cited

U.S. PATENT DOCUMENTS

| | | | | |
|---|---|---|---|---|
| 2006/0048961 A1* | 3/2006 | Pfeiler | ............... | H01B 11/085 174/36 |
| 2007/0037419 A1* | 2/2007 | Sparrowhawk | .... | H01B 11/1008 439/98 |
| 2009/0223694 A1* | 9/2009 | Nordin | ................. | H01B 13/00 174/34 |
| 2009/0294146 A1* | 12/2009 | Nordin | ................. | H01B 11/08 174/32 |
| 2010/0224389 A1* | 9/2010 | Jenner | ............... | H01B 11/1008 174/113 R |
| 2022/0181046 A1* | 6/2022 | Lee | ...................... | H01B 13/26 |

* cited by examiner

FILTERING CABLE

CROSS REFERENCE TO RELATED APPLICATION

This application is for entry into the U.S. National Phase under § 371 for International Application No. PCT/CN2019/091830 having an international filing date of Jun. 19, 2019, and from which priority is claimed under all applicable sections of Title 35 of the United States Code including, but not limited to, Sections 120, 363, and 365(c).

TECHNICAL FIELD

The present application relates to the technical field of cables, in particular to a filtering cable.

BACKGROUND

With the gradual deepening of the information age and the advent of the intelligent age, various electronic devices have been applied to the production and life of people. When electronic devices are in operation, they will possibly be susceptible by electromagnetic interference from other devices in the surrounding environment and also have certain electromagnetic interference on other devices in the environment. Based on this, the electromagnetic compatibility of electrical devices is a very important indicator.

Electromagnetic compatibility refers to the capability that the devices operate in compliance with the requirements in their electromagnetic environment and do not have intolerable electromagnetic interference on other devices in the environment. The stronger the electromagnetic compatibility is, the more stable the devices operate in the electromagnetic environment.

In the related art, various solutions have been proposed in order to meet the electromagnetic compatibility of the device, for example, by designing the cable. Generally speaking, the basic structure of a cable comprises one or more mutually insulated conductors and an outer insulation protection layer. Based on the basic structure of the cable, power or information can be transmitted from one place to another. Currently, based on the basic structure, the solutions to electromagnetic compatibility are as follows:

First, a shielding layer is provided in the cable. The shielding layer comprises a typical aluminum film shielding layer and a copper braided mesh nickel-plated shielding layer. Almost all cables with a complete shielding structure can only shield electromagnetic radiation interference from the outside. There is no significant filtering effect on the signal transmitted on the cable.

Second, the specific structure of the cable of twisted pair structure comprises two copper conductors with an insulating protective layer, and the two copper conductors are twisted together according to a certain density. The electric wave radiated by each conductor during transmission will be canceled by the electric wave emitted from another conductor, which effectively reduces the degree of differential mode signal interference. However, almost all twisted pair cables have functional defects in the filtering function.

Third, the filtering function is added by an external filter between the cable and the electronic device, an interface filter circuit installed in the cable interface inside the electronic device, a filter magnetic ring, a suspension filter rubber pad, a feed-through filter, a cavity filter, a microstrip filter and other structures. However, the complexity of the structure will be increased, and there are some problems such as crosstalk at the front and rear ends of the cable.

For example, the patent document with publication number CN201120412731.9 discloses a cable that implements a filtering function through a filter connector. Taking a cable with a filter connector as an example, almost all the cables with a filter connector have the following defects: 1, the filtering position is concentrated at one end or both ends of the cable, it is not the filter distributed in the axial direction of the cable, and the filtering performance is poor; 2, the design of the filtering function greatly increases the size and weight of the connector, and there are certain restrictions during use: 3. low-pass filters dominate, which is difficult to achieve high-pass, band-pass, band-stop filtering functions.

As another example, the patent document with publication number U.S. Pat. No. 5,686,697 discloses a method for filtering a signal transmitted by a cable by installing a rubber pad carrying a suspended filter circuit inside cable connectors. The typical technology is a line-to-ground common mode filter mounted in a silicon rubber substrate in such a way that the X2Y capacitor is connected in series through a thin conductor between a plug-in core wire and the external shield, or an inter-wire differential mode filter formed in such a way that the X2Y capacitor is connected through a thin conductor between two plug-in core wires. Taking the suspended filter circuit device as an example, almost all the suspended filter circuits have the following defects: 1, the filter circuit built with lumped components has a weak filtering performance for a high frequency since the size of the components used is limited and the number of stages of the formed filter network is very small: 2, there is a large coupling between the input and output cables of the filter circuit, which greatly reduces the filtering effect; 3, the position of the filter circuit is near the connector at one end or both ends of the cable, and the concentrated filtering position leads to a poor effect; 4, the size of the lumped filtering component used is small, the lines constituting the circuit are thin, and there are the problems that heat is dissipated, the filterable interference power is small and the reliability is poor.

As another example, the patent document with publication number CN205790739-U discloses an anti-interference cable assembly, which is implemented by independently installing a ceramic feed-through filter on the core wire at one end or both ends of the shielded cable to achieve the filtering function. Taking the shielded filtering cable installed with ceramic feed-through filter as an example, almost all the shielded filtering cables based on ceramic feed-through filters have the following defects: 1. The feed-through filter takes up more space, and increases the weight and the volume of the plug, which brings great inconvenience to actual use; 2, the position of the filter circuit is near the connector at one end or both ends of the cable, and the concentrated filtering position leads to a poor effect; 3, the filter performance of the feed-through filter is poor, and especially the high-frequency filtering performance is poor: 4. low-pass filters dominate, which is difficult to achieve high-pass, band-pass, band-stop filtering functions.

As another example, the patent documents with publication numbers CN201620666446.2, CN201610365454.8, CN201620087019.9, and CN201521009514.X disclose that the filtering function is achieved by adding magnetic materials, carbon fibers, and metal mixtures inside the cable. Magnetic materials can comprise ferrites, nanocrystalline magnets, or polymer magnets. Taking this type of electromagnetic energy absorption materials as an example, almost all the filtering cables based on electromagnetic energy absorption materials have the following defects: 1, the weight of the cable has increased significantly; 2, there is a certain hardness or brittleness in the material layer, and the turning radius and the number of bending without damage of the cable are limited: 3, the added material layer affects the temperature stability of the cable.

SUMMARY

The purpose of the present application is to provide a filtering cable, which solves the problem that the cable in the related art cannot ensure a simple and reasonable structural design while having good filter performance.

The purpose of the present application is achieved through the following technical solutions:

A filtering cable, wherein a core wire and N defective conductor layers surrounding the core wires are sequentially provided from inside to outside in the cross section in the radial direction of the filtering cable; wherein the defective conductor layer has an etching pattern; the etching pattern is distributed in the axial direction of the filtering cable; the etching pattern is used to make the filtering cable equivalent to a preset filter circuit to filter the signal transmitted in the filtering cable; where the value of N is a positive integer.

Through the above filtering cable, the signal transmitted in the filtering cable can be filtered. On the one hand, the filter is realized through the structure of the cable itself without additional components, and the etching patterns are distributed on the cable, so that each part of the cable has good filtering characteristics. During implementation, the etching pattern on the defective conductor layer can be provided as needed, and the etching pattern is used to make the filtering cable equivalent to a preset filter circuit to achieve any desired filtering effect. On the other hand, the input and output terminals of the filter circuit are distributed at both ends of the filtering cable, there will be no large coupling, and the filter effect is very good. On the other hand, the filtering cable is of a certain size, and the heat dissipation effect, filterable interference power and reliability are also improved. In this way, the cable has good electromagnetic signal filtering characteristics in the case of ensuring the normal power or signal transmission of the cable without excessively increasing the weight and size of the cable. In addition, the defective conductor layer has temperature stability and does not affect the temperature stability of the filtering cable. The defective conductor layer has certain toughness and does not affect performance due to bending.

In a possible design, the etching pattern is periodically or non-periodically distributed in the axial direction of the filtering cable.

In a possible design, the etching area of the etching pattern is hollow or filled with insulating material.

In a possible design, the N defective conductor layers are insulated from or connected with each other.

In a possible design, if the value of N is 1, the etching pattern comprises: a plurality of first patterns;
  the first patterns comprise: a first hollow line segment provided in the radial direction of the filtering cable, one end of the first hollow line segment is provided with a first spiral hollow pattern, and the other end is provided with a second spiral hollow pattern;
  the second spiral hollow pattern and the first spiral hollow pattern are provided symmetrically.

In a possible design, the etching pattern comprises; a plurality of second patterns;
  the second patterns comprise: a first double-ring hollow pattern and a second double-ring hollow pattern spaced from each other;
  the first double-ring hollow pattern and the second double-ring hollow pattern are symmetrical and the axis of symmetry is provided in the radial direction of the filtering cable;
  the first double-ring hollow pattern and the second double-ring hollow pattern have a first non-hollow area at the middle of the side of the outer ring close to the axis of symmetry;
  the first double-ring hollow pattern and the second double-ring hollow pattern have a second non-hollow area at the middle of the side of the inner ring away from the axis of symmetry.

In a possible design, the preset filter circuit comprises a low-pass filter circuit, a band-stop filter circuit or a band-pass filter circuit.

In a possible design, if the value of N is 1, and the preset filter circuit comprises a low-pass filter circuit;
  the etching pattern comprises: a plurality of third patterns: the third patterns comprise: a second hollow line segment in the axial direction of the filtering cable; the second hollow line segment comprises a third hollow line segment, a fourth hollow line segment and a fifth hollow line segment which are symmetrical at both ends of the third hollow line segment and in which the axis of symmetry is provided along the diameter of the filtering cable; a sixth hollow line segment that is spaced side by side with the second hollow line segment; an area on the sixth hollow line segment corresponding to the third hollow line segment has a third non-hollow area, the area on the sixth hollow line segment corresponding to the fourth hollow line segment has a first narrowed hollow area communicated with the fourth hollow line segment, and the area on the sixth hollow line segment corresponding to the fifth hollow line segment has a second narrowed hollow area communicated with the fifth hollow line segment;
  alternatively, the etching pattern comprises: a plurality of fourth patterns: the fourth patterns comprise: two sub-patterns which are symmetrically spaced from each other and in which the axis of symmetry is provided in the radial direction of the filtering cable; and the sub-patterns of the fourth pattern comprise a seventh hollow line segment and an eighth hollow line segment provided side by side in the radial direction of the filtering cable; both ends of the seventh hollow line segment are provided with a first single-ring hollow pattern, respectively; the middle of the side of the first single-ring hollow pattern away from the seventh hollow line segment is provided with a non-hollow area; both ends of the eighth hollow line segment are provided with a second single-ring hollow pattern, respectively: the middle of the side of the second single-ring hollow pattern away from the eighth hollow line segment is provided with a non-hollow area; the area surrounded by the second single-ring hollow pattern is larger than the area surrounded by the first single-ring hollow pattern;
  alternatively, the etching pattern comprises; a plurality of fifth patterns: the fifth patterns comprise: a ninth hollow line segment and a tenth hollow line segment that are provided crosswise; the ninth hollow line segment is provided in the axial direction of the filtering cable and is provided with a first widened hollow area at both ends; the tenth hollow line segment is provided in the radial direction of the filtering cable and is provided with a second widened hollow area at both ends; an area surrounded by the second widened hollow area is larger than the area surrounded by the first widened hollow area;

alternatively, the etching pattern comprises: a plurality of sixth patterns; the sixth patterns comprise: a first U-shaped hollow pattern, a second U-shaped hollow pattern, and a third U-shaped hollow pattern that are sequentially provided; the openings of the first U-shaped hollow pattern, the second U-shaped hollow pattern and the third U-shaped hollow pattern are provided in the radial direction of the filtering cable; wherein the opening direction of the second U-shaped hollow pattern is opposite to the opening direction of the first U-shaped hollow pattern and the third U-shaped hollow pattern; one end of the second U-shaped hollow pattern is communicated with one end of the first U-shaped hollow pattern, and the other end thereof is communicated with one end of the third U-shaped hollow pattern;

alternatively, the etching pattern comprises: a plurality of seventh patterns; the seventh patterns comprise: an eleventh hollow line segment in the radial direction of the filtering cable; both ends of the eleventh hollow line segment are provided with a third widened hollow area, respectively.

In a possible design, if the value of N is 1, and the preset filter circuit comprises a band-stop filter circuit:

the etching pattern comprises: a plurality of eighth patterns: the eighth patterns comprise: a twelfth hollow line segment in the radial direction of the filtering cable: both ends of the twelfth hollow line segment are provided with a third single-ring hollow pattern, respectively; the third single-ring hollow pattern has a non-hollow area on the side close to the twelfth hollow line segment;

alternatively, the etching pattern comprises: a plurality of ninth patterns; the ninth patterns comprise: a thirteenth hollow line segment provided in the radial direction of the filtering cable, a third spiral hollow pattern is provided at one end of the thirteenth hollow line segment, and a fourth spiral hollow pattern is provided at the other end thereof; the third spiral hollow pattern is asymmetrical with the fourth spiral hollow pattern;

alternatively, the etching pattern comprises: a plurality of tenth patterns; the tenth patterns comprise: a fourteenth hollow line segment and a fifteenth hollow line segment spaced side by side in the axial direction of the filtering cable; a sixteenth hollow line segment provided between the fourteenth hollow line segment and the fifteenth hollow line segment in the radial direction of the filtering cable; the middle of the fourteenth hollow line segment is communicated with the middle of the fifteenth hollow line segment through the sixteenth hollow line segment; a third single-ring hollow pattern is provided between the fourteenth hollow line segment and the fifteenth hollow line segment and at both sides of the sixteenth hollow line segment: the middle of the side of the third single-ring hollow pattern close to the sixteenth hollow line segment is provided with a non-hollow area;

alternatively, the etching pattern comprises: a plurality of eleventh patterns: the eleventh patterns comprise: a rectangular fourth single-ring hollow pattern; one pair of sides of the fourth single-ring hollow pattern are provided in the radial direction of the filtering cable, and the other pair of sides thereof is provided in the axial direction of the filtering cable: a seventeenth hollow line segment is provided outside the fourth single-ring hollow pattern, and at both ends of and the middle of one pair of sides provided in the axial direction of the filtering cable, respectively: one end of the seventeenth hollow line segment is communicated with the fourth single-ring hollow pattern; two symmetric L-shaped hollow patterns are provided between the two seventeenth hollow line segments: the corner of the L-shaped hollow pattern is close to the fourth single-ring hollow pattern, one side thereof is close to the seventeenth hollow line segment, is provided in the radial direction of the filtering cable, and is communicated with the close seventeenth hollow line segment through the hollow line segment which is provided in the axial direction of the filtering cable, and the other side thereof is close to the fourth single-ring hollow pattern and is provided in the axial direction of the filtering cable: the area of the core wire corresponding to the fourth single-ring hollow pattern is provided with a through-hole in the radial direction of the filtering cable.

In a possible design, the preset filter circuit comprises a band-pass filter circuit;

the etching pattern comprises: a plurality of twelfth patterns; the twelfth patterns comprise: a first sub-pattern and a second sub-pattern spaced from each other; the first sub-pattern of the twelfth pattern comprises: a fourth U-shaped hollow pattern, a fifth U-shaped hollow pattern and a sixth U-shaped hollow pattern, which are sequentially provided: the openings of the fourth U-shaped hollow pattern, the fifth U-shaped hollow pattern and the sixth U-shaped hollow pattern are provided in the radial direction of the filtering cable; wherein the opening direction of the fifth U-shaped hollow pattern is opposite to the opening direction of the fourth U-shaped hollow pattern and the sixth U-shaped hollow pattern: one end of the fifth U-shaped hollow pattern is communicated with one end of the fourth U-shaped hollow pattern, and the other end thereof is communicated with one end of the sixth U-shaped hollow pattern: the second sub-pattern of the twelfth pattern is a pattern obtained in such a way that the first sub-pattern of the twelfth pattern rotates by 180 degrees in the radial direction of the filtering cable; the area of the core wire corresponding to the interval between the first sub-pattern and the second sub-pattern of the twelfth pattern is provided with a first cut-off area; the first cut-off area is filled with a first dielectric; the boundary of the first sub-pattern and the second sub-pattern of the twelfth pattern corresponding to the core wire is provided with a non-hollow area; the core wires on both sides of the first cut-off region are connected with the defective conductor layer;

alternatively, the etching pattern comprises: a plurality of thirteenth patterns; the thirteenth patterns comprise: a ±-shaped hollow pattern; the first vertical side of the ±-shaped hollow pattern is provided in the radial direction of the filtering cable, the first horizontal side and the second horizontal side are provided in the axial direction of the filtering cable, respectively; the length of the first horizontal side is shorter than the length of the second horizontal side; one end of the second horizontal side is provided with a fifth spiral hollow pattern, and the other end thereof is provided with a sixth spiral hollow pattern completely symmetrical with the fifth spiral hollow pattern; one end of the first horizontal side is provided with a seventh spiral hollow pattern, the seventh spiral hollow pattern is located in the non-hollow area of the fifth spiral hollow pattern, and the other end thereof is provided with an eighth spiral hollow pattern completely symmetrical with the seventh spiral hollow pattern, the eighth spiral hollow pattern is located in the non-hollow area of the sixth spiral hollow pattern, the area of the core wire corresponding to the vertical side is provided with a second cut-off area, and the second cut-off area is filled with a second dielectric;

alternatively, the number of the core wires is 2, the etching pattern comprises: a plurality of fourteenth patterns, the fourteenth patterns comprise: a θ-shaped hollow pattern; and the θ-shaped hollow pattern comprises a third horizontal side, a fourth horizontal side and a fifth horizontal side provided in the axial direction of the filtering cable, and a second vertical side and a third vertical side provided in the radial direction of the filtering cable; the fourth horizontal side is located between the third horizontal side and the fifth horizontal side; the middle of the side of the fourth horizontal side close to the third horizontal side is provided with a non-hollow line segment provided in the radial direction of the filtering cable; the fourth horizontal side is further provided with a first L-shaped non-hollow area, a second L-shaped non-hollow area, and a third L-shaped non-hollow area with a long side in the axial direction of the filtering cable; the long side of the first L-shaped non-hollow area is communicated with the non-hollow line segment, and the short side thereof is communicated with the long side of the second L-shaped non-hollow area; the short side of the second L-shaped non-hollow area is communicated with the long side of the third L-shaped non-hollow area; one of the two core wires is located in the non-hollow area between the third horizontal side and the fourth horizontal side and is provided with a third cut-off area, and the other core wire is located in the non-hollow area between the third horizontal side and the fifth horizontal side, and is provided with a fourth cut-off area the third cut-off area is filled with a third dielectric: and the fourth cut-off area is filled with a fourth dielectric;

alternatively, the etching pattern comprises: a plurality of fifteenth patterns: the fifteenth patterns comprise, a square wave hollow pattern; both ends of the square wave hollow pattern are provided with a fourth widened hollow area in the radial direction of the filtering cable, respectively.

In a possible design, the defective conductor layer is provided in a wound form.

In a possible design, the filtering cable further comprises M shielding layers provided outside the N defective conductor layers and insulated from the N defective conductor layers; wherein the value of M is a positive integer.

DESCRIPTION OF THE EMBODIMENTS

Figure 1:
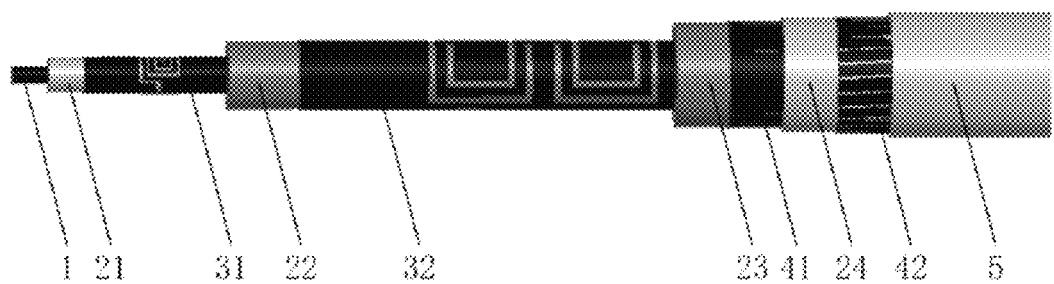
FIG. 1 is a schematic structural diagram of a cable according to an embodiment of the present application.

In order to make the purpose, technical solutions and advantages of the present application clearer, the present application will be described in further detail below with reference to the accompanying drawings.

EMBODIMENTS

This embodiment provides a filtering cable, wherein one or several core wires and N defective conductor layers surrounding the core wires are sequentially provided from inside to outside in the cross section in the radial direction of the filtering cable; wherein the defective conductor layer has an etching pattern; the etching pattern is distributed in the axial direction of the filtering cable; the etching pattern is used to make the filtering cable equivalent to a preset filter circuit to filter the signal transmitted in the filtering cable; where the value of N is a positive integer.

During implementation, the specific value of N can be provided according to actual needs.

The distributed provision indicates that the etching patterns are dispersed at different positions in the axial direction of the cable. Specifically, the etching pattern may be periodically or non-periodically distributed in the axial direction of the filtering cable.

This solution provides a brand new filtering cable, which is implemented based on the defective conductor layer. In the related art, there is no solution to realize a cable with a filtering function based on a defective conductor layer. The inventor of the present application mainly overcomes the following technical difficulties: first, adding periodic or non-periodic etching conductor layer outside the core of the cable can be equivalent to the added inductance and capacitance, and change the distributed capacitance and distributed inductance characteristics of transmission lines. However, due to the complexity of the defect structure, the traditional transmission line theory cannot be used for calculation and analysis, and specific design guidance cannot be given through the basic theory of transmission lines. Moreover, simulation analysis through a computational electromagnetism method also has the problems of complex modeling, limited simulation accuracy, and long calculation time. It is often impossible to obtain the specific structure of the appropriate defective conductor layer. Second, the cable has a specific low-pass, band-pass, band-stop or high-pass filter performance through the defective conductor layer, which requires a very complex structure of the defective conductor layer. A more complex structure needs to be etched on the conductor and there is mutual influence between each structure. There are distributed capacitance and inductance among any structures, which have a great impact on the function of the filtering cable. Third, the filtering function realized by the single-layer defective conductor layer is relatively limited. In the case of high filtering performance requirements, a multi-layer defective conductor layer needs to be used to achieve the high-performance filtering function. The multi-layer defective conductor layers must be collaboratively designed, and the impact of specific interlayer coupling problems on the filtering performance is analyzed. Fourth, the impact of the bending, dragging, stretching and other operations, high and low temperature, and humidity in the cable environment on the performance of the filtering cable should be controlled to a small range, which requires the use of a lightweight, distributed parameter structure to meet the requirements. The inventor of the present application overcomes the above technical difficulties and provides a filtering cable based on a defective conductor layer to achieve a good filter effect.

In the filtering cable provided by this solution, by adding a defective conductor layer outside the core wire, the defective conductor layer has an etching pattern. Since the etching pattern can make the filtering cable equivalent to a preset filter circuit, the signal transmitted in the filtering cable can be filtered. On the one hand, the filter is realized through the structure of the cable itself without additional components, and the etching patterns are distributed on the cable, so that each part of the cable has good filtering characteristics. During implementation, the etching pattern on the defective conductor layer can be provided as needed, and the etching pattern is used to make the filtering cable equivalent to a preset filter circuit to achieve any desired filtering effect. On the other hand, the input and output terminals of the filter circuit are distributed at both ends of the filtering cable, there will be no large coupling, and the filter effect is very good. On the other hand, the filtering cable is of a certain size, and the heat dissipation effect, filterable interference power and reliability are also improved. In this way, the cable has good electromagnetic signal filtering characteristics in the case of ensuring the normal power or signal transmission of the cable without excessively increasing the weight and size of the cable. In addition, the defective conductor layer has temperature stability and does not affect the temperature stability of the filtering cable. The defective conductor layer has certain toughness and does not affect performance due to bending.

The filtering cable provided by this solution can be, but not limited to, used for the interconnection between electronic devices, the interconnection between electronic devices and power supply devices, the interconnection between modules within electronic devices, the interconnection between modules within an intelligent robot, and the interconnection between the inside and the outside of an intelligent numerically-controlled machine tool that requires power and signal wired transmission. The connector of the filtering cable of the present application is installed, which can form an electromagnetic connection with the housing of the electronic devices, and can effectively filter out electromagnetic interference signals. In the case of electromagnetic pulse interference such as electronic countermeasure interference, lightning, static electricity, nuclear explosion, high-power microwave weapons, electromagnetic pulse bombs, etc., the filtering cable of the present application can effectively suppress the electromagnetic stress coupled on the filtering cable to realize the function of protecting electronic devices from electromagnetic interference.

The above core wire is located at the innermost layer of the cross section of the cable. There may be one or more core wires. The specific structure of each core wire may comprise a solid columnar shape (such as a cylinder) or a hollow tubular shape. Each core wire may further comprise single-strand core wires or multiple-strand core wires. Specifically, the material of the core wire may include, but is not limited to, metal, graphene, metal alloy, metal plating, or conductive polymer. For example, the material of the metal wire may comprise pure copper, silver-plated copper, or steel ladle silver-plated copper.

During implementation, a first filler layer may be provided between the defective conductor layer and the core wire. The material of the first filler layer may include, but is not limited to, polytetrafluoroethylene or polyethylene, and may be uniformly wrapped outside the core wire by winding or extrusion foaming.

If the value of the number N of defective conductor layers is greater than or equal to 2, the N defective conductor layers are insulated or communicated with each other. Specifically, a second filling layer is provided between the N defective conductor layers. The material of the second filling layer may include, but is not limited to, polytetrafluoroethylene or polyethylene, or a flexible printed circuit board made of a flexible medium such as a polyimide film or a Liquid Crystal Polymer (LCP) film may be used.

A typical implementation of the defective conductor layer is a flexible printed circuit board made of a flexible medium such as a polyimide film or a LCP film. The flexible printed circuit board can be substrates for radio frequency, microwave or millimeter wave applications because they combine excellent electrical performance and good processing performance. The material of the flexible dielectric substrate is uniform, so the dielectric properties of the flexible dielectric substrate are very uniform. For different material formulas, the relative dielectric constant of the polyimide film can be between 2.2 and 3.8, and the dielectric loss tangent can be less than 0.008. The relative dielectric constant of the industrialized liquid crystal polymer film is 3.3, and the dielectric loss tangent is less than 0.005. In addition, the water absorption rate of the flexible dielectric substrate material is very low (less than 0.04% at 23° C. and 50% relative humidity), so the size and dielectric properties do not change much under humid conditions. Based on these properties, it is very easy to design and fabricate different types of defective conductor layers with a flexible dielectric substrate and apply them to filtering cables with different characteristics.

The etching area of the above etching pattern in the defective conductor layer may be hollow without any treatment, or may be filled with an insulating material, wherein the filled insulating material may include, but is not limited to, polytetrafluoroethylene or polyethylene.

In a possible design, the cable further comprises M shielding layers provided outside the N defective conductor layers and insulated from the N defective conductor layers. The value of M is a positive integer. During implementation, the value of M can be set according to actual needs.

The shielding layer may include, but is not limited to, a silver-plated copper tape, an ultra-light silver-plated metal braided layer, or a silver-plated copper braided mesh.

During implementation, a third filling layer is provided between the shielding layer and the defective conductor layer for filling. The material of the third filling layer may be, but not limited to, polytetrafluoroethylene or polyethylene, and may be uniformly wrapped outside the defective conductor layer by winding or extrusion foaming.

If the value of the number M of the shielding layers is greater than or equal to 2, the M shielding layers are insulated from or connected to each other. Specifically, a fourth filling layer is provided between the M defective conductor layers for insulating. The material of the fourth filling layer may include, but is not limited to, fluorinated ethylene propylene polymer, etc.

In order to protect the filtering cable, the filtering cable may further comprise an outer sheath provided outside the M shielding layers. The outer sheath is a structure that physically protects the filtering cable at the outermost layer of the filtering cable and prolongs the service life of the filtering cable. The material of the outer sheath may be, but not limited to, polytetrafluoroethylene, polyethylene, fluorinated ethylene propylene polymer, silicone rubber, polyurethane, stainless steel, RADOX, neoprene or low-smoke halogen-free materials.

During implementation, connectors can be installed at both ends of the filtering cable, which is convenient to use.

A specific structure of a filtering cable is exemplified hereinafter.

As shown in FIG. 1, the filtering cable provided in this embodiment sequentially comprises a core wire 1, a first filling layer 21 surrounding the core wire 1, a first defective conductor layer 31, a second filling layer 22, a second defective conductor layer 32, a third filling layer 23, a first shielding layer 41, a fourth filling layer 24, a second shielding layer 42, and an outer sheath 5 from inside to outside in the cross section in the radial direction of the filtering cable. The structure of a filtering cable shown in FIG. 1 is only an example, and is not limited, and other structures may also be used.

Figure 2:
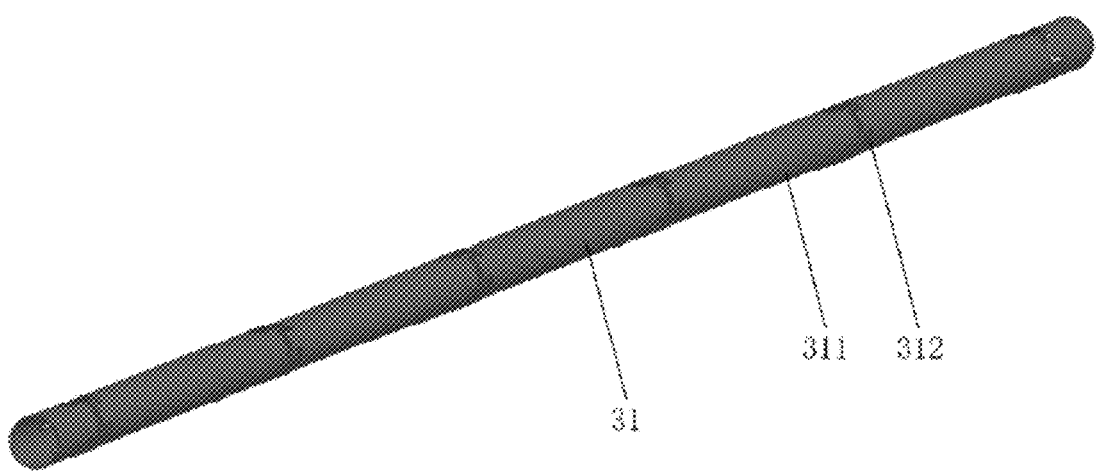
FIG. 2 is a schematic structural side diagram of a first defective conductor layer according to another embodiment of the present application.
Figure 3:
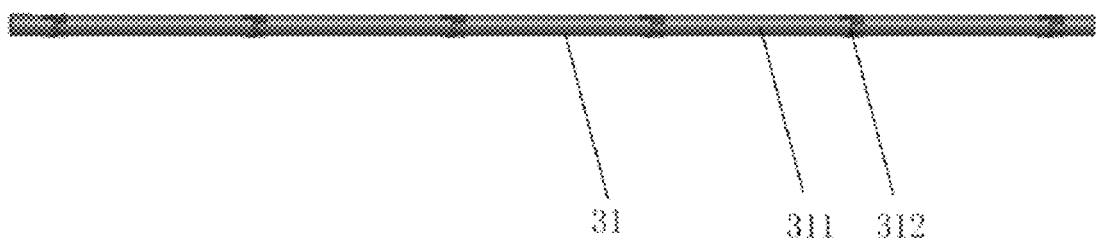
FIG. 3 is a schematic structural front diagram of a first defective conductor layer according to another embodiment of the present application.
Figure 4:
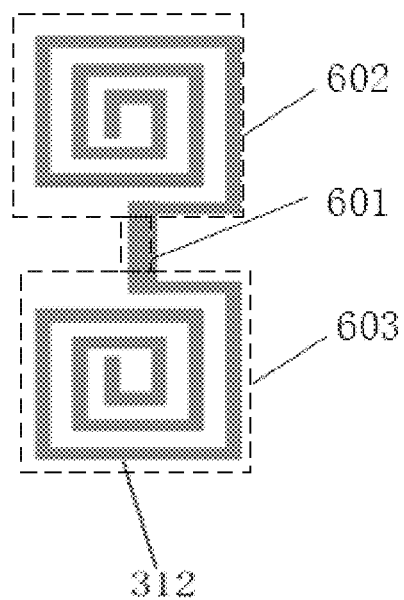
FIG. 4 is a schematic diagram of an etching pattern of a first defective conductor layer according to another embodiment of the present application.
Figure 5:
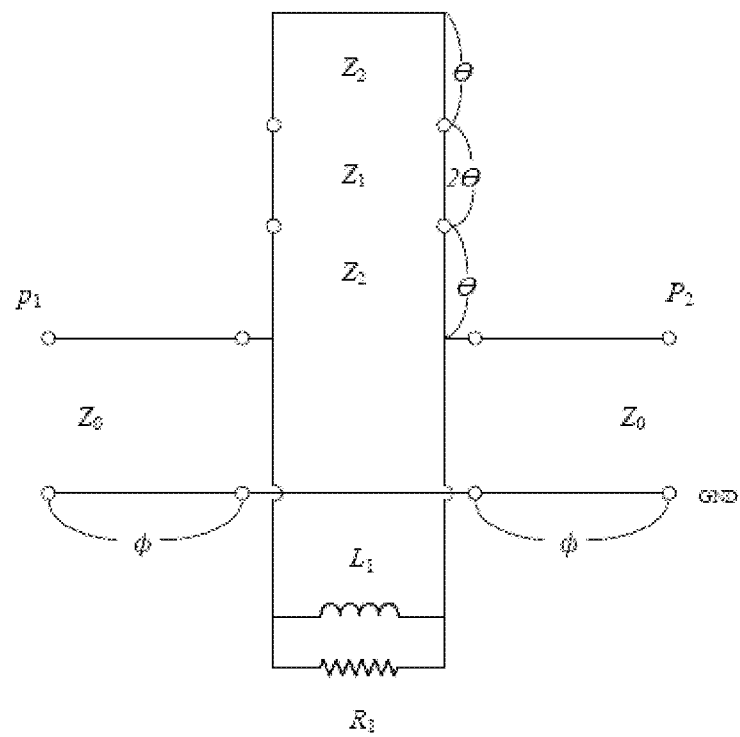
FIG. 5 is a schematic diagram of an equivalent circuit of an etching pattern of a first defective conductor layer according to another embodiment of the present application.

As shown in FIGS. 2, 3 and 4, the first defective conductor layer 31 etches a periodically or non-periodically etching pattern 312 of a first defective conductor layer on the conductor 311 of the first defective conductor layer on the cylindrical surface of the first filling layer 21, and the etched part may be hollow or filled with insulating material in situ. In this embodiment, as shown in FIG. 4, the etching pattern 312 obtained by periodically etching a part of the first defective conductor layer on the cylindrical surface of the conductor 311 of the first defective conductor layer comprises a spiral etching pattern. Specifically, the etching pattern comprises; a plurality of first patterns; in FIG. 4, the first pattern comprises: a first hollow line segment 601 provided in the radial direction of the filtering cable, one end of the first hollow line segment 601 is provided with a first spiral hollow pattern 602, and the other end is provided with a second spiral hollow pattern 603; the second spiral hollow pattern 603 and the first spiral hollow pattern 601 are provided symmetrically. Based on this, as shown in FIG. 5, the etching pattern of the first defective conductor layer 31 can make the filtering cable equivalent circuit to be: the transmission line intrinsic impedance Z0 (the equivalent electric length φ) between the first node $P_1$ and the second node $P_2$ is connected in parallel with a short-circuit short-harmonic line with the impedance $Z_2$ and the equivalent electrical length Θ, the impedance $Z_1$ and the equivalent electrical length 2Θ, and the impedance $Z_2$ and the equivalent electrical length Θ, and is connected in parallel with the first inductor $L_1$ and the first resistor $R_1$.

The first node is the input terminal of the filtering cable, the second node is the output terminal of the filtering cable, and the equivalent circuit between the first node $P_1$ and the second node $P_2$ varies with the etching pattern.

The second filling layer 22 tightly wraps the first defective conductor layer 31 to form a cylindrical structure together. Specifically, the second filling layer 22 is uniformly wrapped outside the first defective conductor layer 31 using an insulating material such as polytetrafluoroethylene or polyethylene by winding or extrusion foaming.

Figure 6:
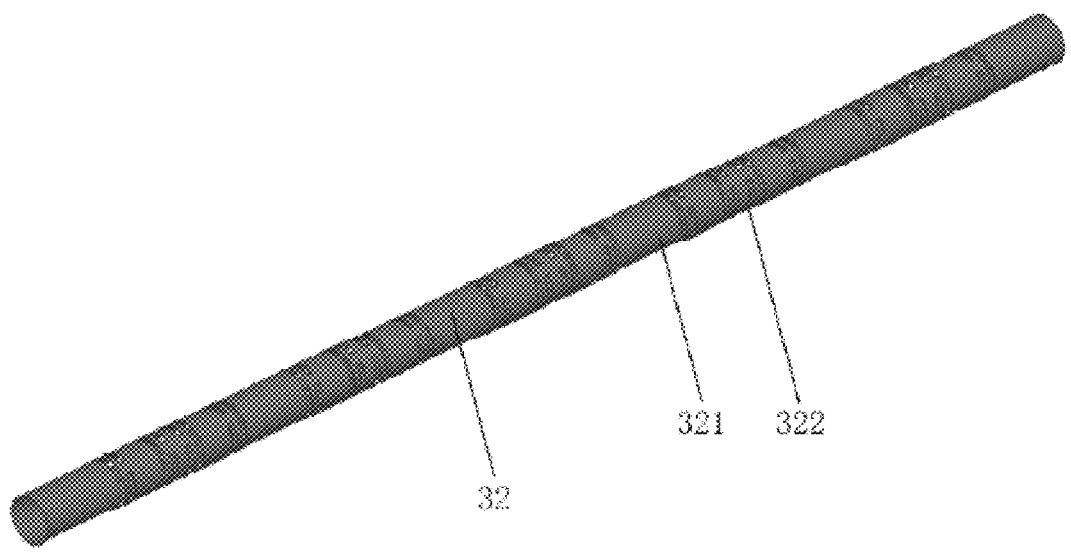
FIG. 6 is a schematic structural side diagram of a second defective conductor layer according to another embodiment of the present application.
Figure 7:
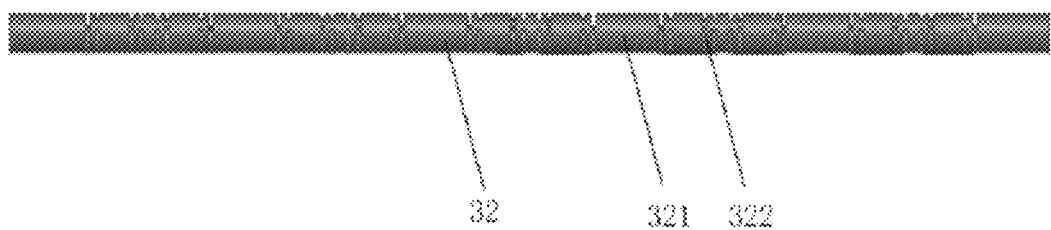
FIG. 7 is a schematic structural front diagram of a second defective conductor layer according to another embodiment of the present application.
Figure 8:
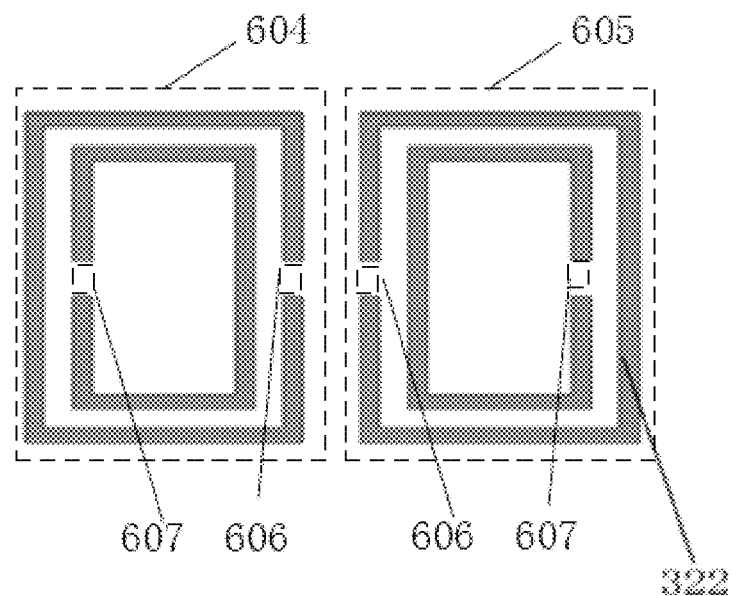
FIG. 8 is a schematic diagram of an etching pattern of a second defective conductor layer according to another embodiment of the present application.

As shown in FIGS. 6, 7 and 8, the second defective conductor layer 32 etches a periodically or non-periodically etching pattern 322 of a first defective conductor layer on the conductor 321 of the second defective conductor layer on the cylindrical surface of the second filling layer 22, and the etched part may be hollow or filled with insulating material such as polytetrafluoroethylene or polyethylene in situ. In this embodiment, the etching pattern 322 obtained by periodically etching a part of the second defective conductor layer on the cylindrical surface of the conductor 321 of the second defective conductor layer is shown in FIG. 8. The etching pattern comprises: a plurality of second patterns; in FIG. 8, the second patterns comprise: a first double-ring hollow pattern 604 and a second double-ring hollow pattern 605 spaced from each other; the first double-ring hollow pattern 604 and the second double-ring hollow pattern 605 are symmetrical and the axis of symmetry is provided in the radial direction of the filtering cable; the first double-ring hollow pattern 604 and the second double-ring hollow pattern 605 have a first non-hollow area 606 at the middle of the side of the outer ring close to the axis of symmetry; the first double-ring hollow pattern 604 and the second double-ring hollow pattern 605 have a second non-hollow area 607 at the middle of the side of the inner ring away from the axis of symmetry.

There are various shapes of the first double-ring hollow patterns 604 and the second double-ring hollow patterns 605, which may be, but not limited to, rectangular, which are illustrated by rectangles in the figure.

Figure 9:
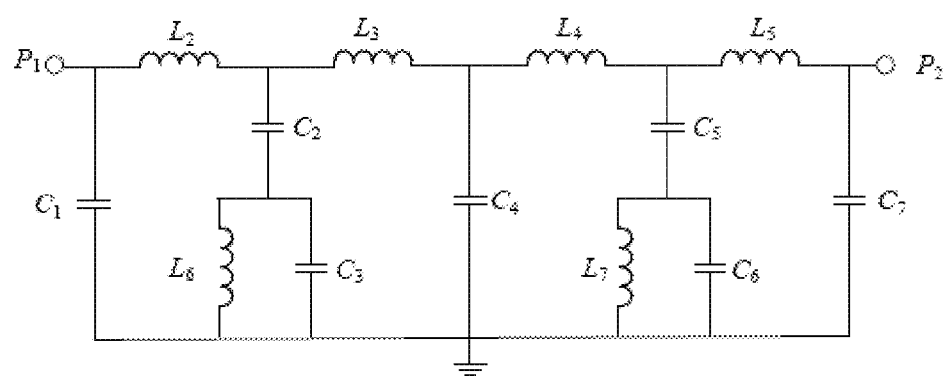
FIG. 9 is a schematic diagram of an equivalent circuit of an etching pattern of a defective conductor layer according to another embodiment of the present application.

The second defective conductor layer 32 can make the filtering cable equivalent to the equivalent circuit shown in FIG. 9. The equivalent circuit in FIG. 9 comprises a second inductor $L_2$, a third inductor $L_3$, a fourth inductor $L_4$, a fifth inductor $L_5$, a sixth inductor $L_6$, a seventh inductor $L_7$, a first capacitor $C_1$, a second capacitor $C_2$, a third capacitor $C_3$, a fourth capacitor $C_4$, a fifth capacitor $C_5$, a sixth capacitor $C_6$, and a seventh capacitor $C_7$. The first end of the second inductor $L_2$ is connected to the first node $P_1$ and the first end of the first capacitor $C_1$, respectively, and the second end of the second inductor $L_2$ is connected to the first end of the third inductor $L_3$ and the first end of the second capacitor $C_2$, respectively; the second end of the third inductor $L_3$ is connected to the first end of the fourth inductor $L_4$ and the first end of the fourth capacitor $C_4$, respectively; the second end of the fourth inductor $L_4$ is connected to the first end of the fifth inductor $L_5$ and the first end of the fifth capacitor $C_5$, respectively, and the second end of the fifth inductor $L_5$ is connected to the first end of the seventh capacitor $C_7$ and the second node $P_2$, respectively. The second end of the second capacitor $C_2$ is connected to the first end of the sixth inductor $L_6$ and the first end of the third capacitor $C_3$, respectively; the second end of the fifth capacitor $C_5$ is connected to the first end of the seventh inductor $L_7$ and the first end of the sixth capacitor $C_6$, respectively; the second end of first capacitor $C_1$, the second end of the sixth inductor $L_6$, the second end of third capacitor $C_3$, the second end of fourth capacitor $C_4$, the second end of seventh inductor $L_7$, the second end of the sixth capacitor $C_6$ and the second end of the seventh capacitor $C_7$ are all grounded.

The third filling layer 23 tightly wraps the second defective conductor layer 32 to form a cylindrical structure together. Specifically, the third filling layer 23 is uniformly wrapped outside the second defective conductor layer using an insulating material such as polytetrafluoroethylene or polyethylene by winding or extrusion foaming.

The first shielding layer 41 wraps one or more metal shielding layers outside the third insulating layer 23. For example, the first shielding layer is a silver-plated copper tape.

The fourth insulating layer 24 tightly wraps the first shielding layer 41 to form a cylindrical structure. For example, the material of the fourth filling layer comprises fluorinated ethylene propylene polymer.

The second shielding layer 42 wraps one or more metal shielding layers on the outside of the fourth insulating layer 24. For example, the second shielding layer is an ultra-light silver-plated metal braided layer or a silver-plated copper braided mesh.

The first defective conductor layer 31, the second defective conductor layer 32, the first shielding layer 41, and the second shielding layer 42 may be connected together as needed to form a common ground connection.

Figure 10:
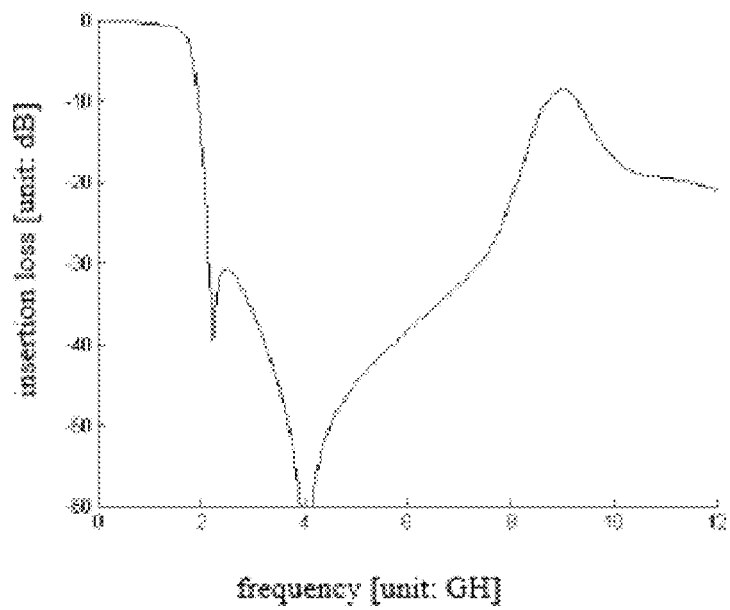
FIG. 10 is a filter effect diagram of a filtering cable according to another embodiment of the present application.

As shown in FIG. 10, from the insertion loss effect diagram achieved by the filtering cable based on the defective conductor layer in this embodiment, it can be seen that the filtering cable based on the defective conductor layer is a low-pass filtering cable. The insertion loss effect achieved by the filtering cable based on the defective conductor layer with the length of 0.1 m is as follows: the insertion loss at 0-2 GHz is less than 0.5 dB, and the insertion loss at 2.2-8 GHz is greater than 30 dB. In FIG. 10, the abscissa represents frequency in units of GHz (i.e., GH), and the ordinate represents insertion loss in units of dB (i.e., difference loss).

In specific implementation, etching patterns of various structures can be designed according to actual needs to achieve the various required effects of the filter circuit. In a possible design, the preset filter circuit may comprise a low-pass filter circuit, a band-stop filter circuit, or a band-pass filter circuit. The structure of different etching patterns is exemplified hereinafter.

Structure ONE:

If the value of N is 1, and the preset filter circuit comprises a low-pass filter circuit, the etching pattern comprises: a plurality of third patterns.

Figure 11:
FIG. 11 is a schematic structural side diagram of a defective conductor layer according to another embodiment of the present application.
Figure 12:
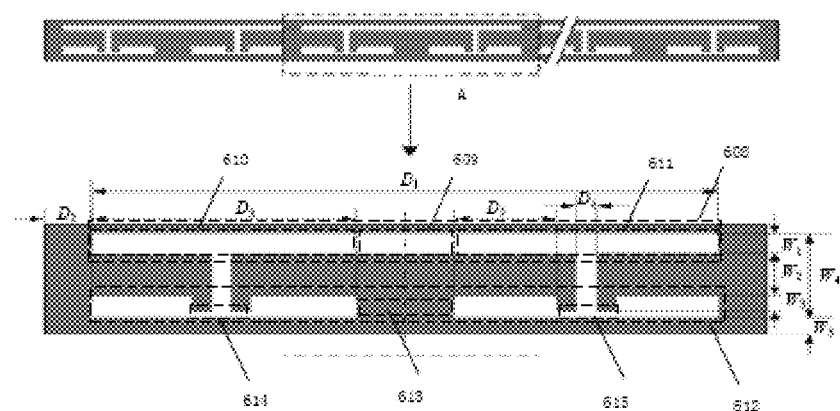
FIG. 12 is a schematic structural diagram of an etching pattern of a defective conductor layer shown in FIG. 11 according to another embodiment of the present application.

As shown in FIGS. 11 and 12, FIG. 12 shows a specific structure of one period of the etching pattern (the third pattern shown by the dotted frame A). The third patterns comprise: a second hollow line segment 608 in the axial direction of the filtering cable; the second hollow line segment 608 comprises a third hollow line segment 609, a fourth hollow line segment 610 and a fifth hollow line segment 611 which are symmetrical at both ends of the third hollow line segment and in which the axis of symmetry is provided along the diameter of the filtering cable; a sixth hollow line segment 612 that is spaced side by side with the second hollow line segment 608; an area on the sixth hollow line segment 612 corresponding to the third hollow line segment 609 has a third non-hollow area 613, the area on the sixth hollow line segment 612 corresponding to the fourth hollow line segment 610 has a first narrowed hollow area 614 communicated with the fourth hollow line segment 610, and the area on the sixth hollow line segment 612 corresponding to the fifth hollow line segment 611 has a second narrowed hollow area 615 communicated with the fifth hollow line segment 611, wherein the width of the first narrowed hollow area 614 and the second narrowed hollow area 615 in the radial direction of the filtering cable is smaller than the width of other positions on the sixth hollow line segment 612.

This embodiment provides a low-pass filtering cable based on an asymmetric PI (i.e., π)-shaped defective conductor layer, as shown in FIG. 11. In specific implementation, a copper layer with 10 cascaded asymmetric PI-shaped third patterns can be constructed on a polyimide film substrate and is wrapped around the insulating layer of the filtering cable, which realizes the low-pass filtering function of the filtering cable. The third pattern in FIG. 12 is a structural diagram of a resonance unit A. Typical values of the structural parameters are as follows: the relative dielectric constant of the polyimide film substrate is $\varepsilon r=3.8$, the loss tangent is $\tan \delta=0.008$, and the substrate size is length Lsub×width Wsub×height Hsub=100 mm×2.6 mm×0.254 mm. The size of the resonance unit is as follows: the length of the second hollow line segment 608 in the axial direction of the filtering cable is $D_1=9.3$ mm, the period interval distance of the third pattern is $D_2=0.7$ mm, the length of the fourth hollow line segment 610 in the axial direction of the filtering cable is $D_3=3.9$ mm, the length of the area of the first narrowed hollow 614 for communication and the area of the second narrowed hollow area 615 for communication in the axial direction of the filtering cable is $D_4=0.3$ mm, the length on the sixth narrowed line segment 612 located between the first narrowed hollow area 614 and the third non-hollow area 613 and the length on the sixth hollow line segment 612 located between the second narrowed hollow area 615 and the third non-hollow area 613 are $D_5=1.5$ mm, the diameter of the filtering cable insulating layer is Dr=1.07 mm, the diameter of the inner conductor is Di=0.5 mm. The length of the second hollow line segment 608 in the radial direction of the filtering cable is $W_1=0.465$ mm, the distance between both sides of the second hollow line segment 608 close to the sixth hollow line segment 612 is $W_2=1$ mm, the line width of the first narrowed hollow area 614 and the second narrowed hollow area 615 is narrower than the line width of other positions on the sixth hollow line segment 612 by $W_3=0.4$ mm, the distance between both sides of the second hollow line segment 608 away from the sixth hollow line segment 612 is $W_4=1.965$ mm, and the side of the sixth hollow line segment 612 away from the second hollow line segment 608 has at least a length $W_5=0.45$ mm of the non-hollow area in the radial direction of the filtering cable. The parameters $D_1$ and $D_3$ become larger, which can reduce the frequency of response. If the radius of the filtering cable is small, the resonant frequency of the filter is lower and the effect becomes better. The filtering cable implemented by the structure of this embodiment has a strong transition band (TB), an ultra-wide stop-band (SB) and a very high stop-band performance. The defective conductor layer with 10 cascaded resonance units provided in this embodiment has a compact size of 100 mm×2.6 mm×0.254 mm, the insertion loss is less than 1.9 dB at 2.2 GHz, and a wide SB greater than 50 dB is provided in the range of 2.7 GHz to 12 GHz. The flexible low-pass filtering cable proposed in this embodiment has a function of good transmission and low-pass filtering, and it is possible to replace traditional RF coaxial cables in wireless terminals.

Structure Two:

If the value of N is 1, and the preset filter circuit comprises a low-pass filter circuit, the etching pattern comprises: a plurality of fourth patterns.

Figure 13:
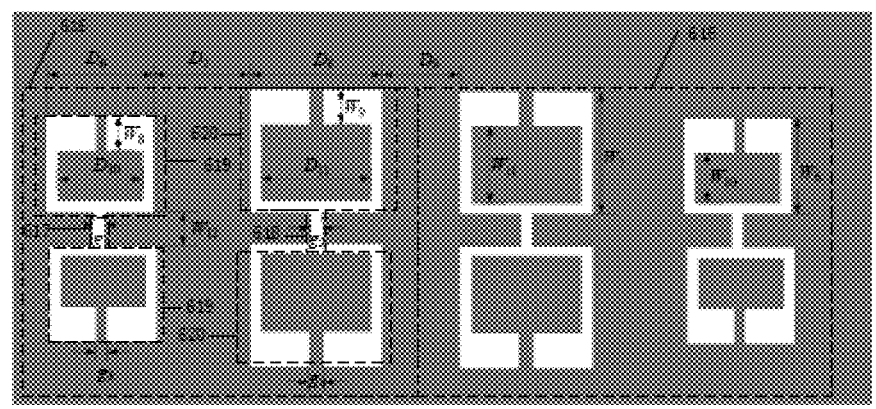
FIG. 13 is a schematic structural diagram of an etching pattern of a defective conductor layer according to another embodiment of the present application.

As shown in FIG. 13, the fourth patterns comprise: two sub-patterns 616 which are symmetrically spaced from each other and in which the axis of symmetry is provided in the radial direction of the filtering cable. The sub-patterns 616 of the fourth pattern comprise a seventh hollow line segment 617 and an eighth hollow line segment 618 provided side by side in the radial direction of the filtering cable; both ends of the seventh hollow line segment 617 are provided with a first single-ring hollow pattern 619, respectively; the middle of the side of the first single-ring hollow pattern 619 away from the seventh hollow line segment 617 is provided with a non-hollow area; both ends of the eighth hollow line segment 618 are provided with a second single-ring hollow pattern 620, respectively; the middle of the side of the second single-ring hollow pattern 620 away from the eighth hollow line segment 618 is provided with a non-hollow area: the area surrounded by the second single-ring hollow pattern 620 is larger than the area surrounded by the first single-ring hollow pattern 619, wherein the widths of the corresponding hollow line segments of the first ring hollow pattern 619 and the second ring hollow pattern 620 are the same. The widths of the seventh hollow line segment, the eighth hollow line segment, the non-hollow area of the first ring hollow pattern and the non-hollow area of the second ring hollow pattern in the axial direction of the filtering cable are the same.

Figure 14:
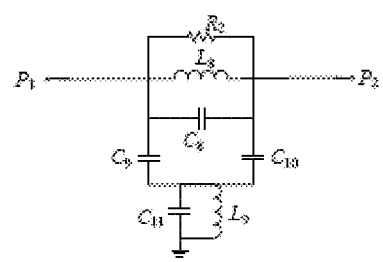
FIG. 14 is a schematic diagram of an equivalent circuit structure of an etching pattern of a defective conductor layer shown in FIG. 13 according to another embodiment of the present application.

It can be seen from FIG. 13 that the fourth pattern is very similar to a dumbbell structure as a whole. It can be considered that the defective conductor layer of the low-pass filtering cable provided in this embodiment embeds a T-shaped region on the basis of the dumbbell-shaped structure. The two transmission zeros produced by the new defective conductor layer structure are both lower than those produced by etching a dumbbell-shaped defective conductor layer of the same square area size. During implementation, the shapes of the second single-ring hollow pattern 620 and the first single-ring hollow pattern 619 may be, but not limited to, rectangular, which are illustrated by rectangles in the figure. The corresponding size can be set according to actual needs. For example, the size of the structure shown in FIG. 13 is as follows: the axial length of the outer ring of the first single-ring hollow pattern 619 is $D_6=5$ mm, the distance between the first single-ring hollow pattern 619 and the second single-ring hollow pattern 620 is $D_7=6$ mm, the width of the outer ring of the second single-ring hollow pattern 620 is $D_8=8$ mm, the distance between the second single-ring hollow patterns 620 of the two sub-patterns is $D_9=6$ mm, the length of the inner ring of the first single-ring hollow pattern 619 in the axial direction of the filtering cable is $D_{10}=4$ mm, the length of the inner ring of the second single-ring hollow pattern 620 in the axial direction of the filtering cable is $D_{11}=7$ mm, the length of the outer ring of the first single-ring hollow pattern 619 in the radial direction of the filtering cable is $W_6=3$ mm, the length of the outer ring of the second single-ring hollow pattern 620 in the radial direction of the filtering cable is $W_7=5$ mm, the length of one side of the first single-ring hollow pattern 619 with a non-hollow area in the radial direction of the filtering cable is $W_8=1$ mm, the length of one side of the second single-ring hollow pattern 620 with a non-hollow area in the radial direction of the filtering cable is $W_9=1$ mm, the length of the inner ring of the first single-ring hollow pattern 619 in the radial direction of the filtering cable is $W_{10}=1.5$ mm, the length of the inner ring of the second single-ring hollow pattern 620 in the radial direction of the filtering cable is $W_{11}=3.5$ mm, the length of the seventh hollow line segment and the eighth hollow line segment in the radial direction of the filtering cable is $W_{12}=1.5$ mm, and the width of the seventh hollow line segment in the radial direction of the filtering cable $g_1=$the width of the eighth hollow line segment in the radial direction of the filtering cable $g_2=$the length of the non-hollow area provided in the first single-ring hollow pattern 619 in the radial direction of the filtering cable $g_3=$the length of the non-hollow area provided in the second single-ring hollow pattern 620 in the radial direction of the filtering cable $g_4=0.4$ mm. The structure of this embodiment can make the filtering cable equivalent to the equivalent circuit shown in FIG. 14. The equivalent circuit shown in FIG. 14 comprises a second resistor $R_2$, an eighth capacitor $C_8$, a ninth capacitor $C_9$, a tenth capacitor $C_{10}$, an eleventh capacitor $C_{11}$, an eighth inductor $L_8$, and a ninth inductor $L_9$. The first end of the second resistor $R_2$ is connected to the first node $P_1$, the first end of the eighth inductor $L_8$, the first end of the eighth capacitor $C_8$, and the first end of the ninth capacitor $C_9$, respectively, and the second end thereof is connected to the second nodes $P_2$, the second end of the eighth inductor $L_8$, the second end of the eighth capacitor $C_8$, and the first end of the tenth capacitor $C_{10}$, respectively: the second end of the ninth capacitor $C_9$ is connected to the first end of the eleventh capacitor $C_{11}$, the first end of the ninth inductor $L_9$ and the second end of the tenth capacitor $C_{10}$, respectively; the second end of the eleventh capacitor $C_{11}$ and the second end of the ninth inductor $L_9$ are both grounded. The filtering performance based on this structure comprises: obtaining a low-pass filter with a cutoff frequency of 3 dB, showing a very sharp cutoff frequency response and an ultra-wide stop-band at 4 GHz, and having the suppression at 4.2 to 23 GHz higher than 25 dB.

Figure 15:
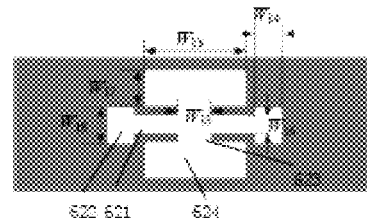
FIG. 15 is a schematic structural diagram of an etching pattern of a defective conductor layer according to another embodiment of the present application.

Structure Three:

If the value of N is 1, and the preset filter circuit comprises a low-pass filter circuit, the etching pattern comprises: a plurality of fifth patterns. As shown in FIG. 15, the fifth patterns comprise: a ninth hollow line segment 621 and a tenth hollow line segment 623 that are provided crosswise; the ninth hollow line segment 621 is provided in the axial direction of the filtering cable and is provided with a first widened hollow area 622 at both ends; the tenth hollow line segment 623 is provided in the radial direction of the filtering cable and is provided with a second widened hollow area 624 at both ends; an area surrounded by the second widened hollow area 623 is larger than the area surrounded by the first widened hollow area 622.

Figure 16:
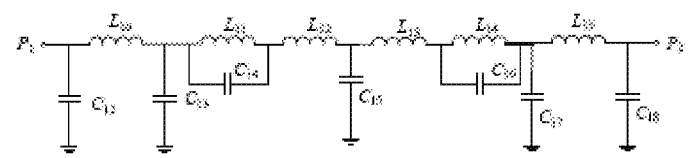
FIG. 16 is a schematic diagram of an equivalent circuit structure of an etching pattern of a defective conductor layer shown in FIG. 15 according to another embodiment of the present application.

This embodiment provides a low-pass filtering cable based on a crossed dumbbell-shaped defective conductor layer. As can be seen from FIG. 15, the low-pass filtering cable based on a crossed dumbbell-shaped defective conductor layer implements the low-pass filtering function by two cross-shaped dumbbell-shaped structures, which can achieve higher stop-band suppression and wider band stop-band characteristics than dumbbell-shaped structures. Based on the structure of FIG. 15, specific parameters can be set according to actual needs. For example, in some embodiments, the specific parameters are as follows: the length of the second widened hollow area 624 in the axial direction of the filtering cable is $W_{13}=12$ mm, the length of the first widened hollow area 622 in the axial direction of the filtering cable is $W_{14}=3$ mm, the length of the tenth hollow section 623 in the axial direction of the filtering cable $W_{15}=$the length of the ninth hollow section 621 in the radial direction of the filtering cable $W_{16}=2$ mm, the length of the second widened hollow area 624 in the radial direction of the filtering cable is $W_{17}=5$ mm, and the length of the first widened hollow area 622 in the radial direction of the filtering cable is $W_{18}=5$ mm. The structure of this embodiment can make the filtering cable equivalent to the equivalent circuit shown in FIG. 16. The circuit in FIG. 16 comprises a tenth inductor $L_{10}$, an eleventh inductor $L_{11}$, a twelfth inductor $L_{12}$, a thirteenth inductor $L_{13}$, a fourteenth inductor $L_{14}$, a fifteenth inductor $L_{15}$, a twelfth capacitor $C_{12}$, a thirteenth capacitor $C_{13}$, a fourteenth capacitor $C_{14}$, a fifteenth capacitor $C_{15}$, a sixteenth capacitor $C_{16}$, a seventeenth capacitor $C_{17}$, and a eighteenth capacitor $C_{18}$. The first end of the tenth inductor $L_{10}$ is connected to the first node $P_1$ and the first end of the twelfth capacitor $C_{12}$, respectively, and the second end thereof is connected to the first end of the thirteenth capacitor $C_{13}$, the first end of the eleventh inductor $L_{11}$, and the first end of the fourteenth capacitor $C_{14}$; the second end of the eleventh inductor $L_{11}$ is connected to the second end of the fourteenth capacitor $C_{14}$ and the first end of the twelfth inductor $L_{12}$, respectively; the second end of the twelfth inductor $L_{12}$ is connected to the first end of the thirteenth inductor $L_{13}$ and the first end of the fifteenth capacitor $C_{15}$, respectively: the second end of the thirteenth inductor $L_{13}$ is connected to the first end of the fourteenth inductor $L_{14}$ and the first end of the sixteenth capacitor $C_{16}$, respectively; the second end of the fourteenth inductor $L_{14}$ is connected to the second end of the sixteenth capacitor $C_{16}$, the first end of the fifteenth inductor $L_{15}$, and the first end of the seventeenth capacitor $C_{17}$, respectively; the second end of the fifteenth inductor $L_{15}$ is connected to the second node $P_2$ and the first end of the eighteenth capacitor $C_{18}$, respectively; the second end of the twelfth capacitor $C_{12}$, the second end of the thirteenth capacitor $C_{13}$, the second end of the fifteenth capacitor $C_{15}$, the second end of the seventeenth capacitor $C_{17}$, and the second end of the eighteenth capacitor $C_{18}$ are grounded, respectively. The filtering performance based on this structure comprises: insertion loss from DC to 3.5 GHz less than 2 dB, and suppression from 4.3 to 15.8 GHz higher than 20 dB.

Figure 17:
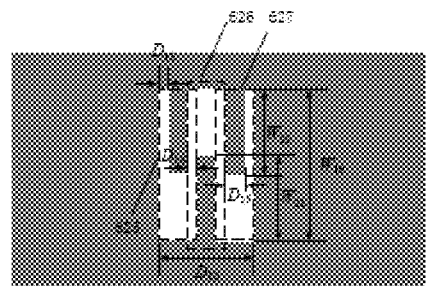
FIG. 17 is a schematic structural diagram of an etching pattern of a defective conductor layer according to another embodiment of the present application.

Structure Four:

If the value of N is 1, and the preset filter circuit comprises a low-pass filter circuit, the etching pattern comprises: a plurality of sixth patterns; as shown in FIG. 17, the sixth patterns comprise: a first U-shaped hollow pattern 625, a second U-shaped hollow pattern 626, and a third U-shaped hollow pattern 627 that are sequentially provided; the openings of the first U-shaped hollow pattern 625, the second U-shaped hollow pattern 626 and the third U-shaped hollow pattern 627 are provided in the radial direction of the filtering cable; wherein the opening direction of the second U-shaped hollow pattern 626 is opposite to the opening direction of the first U-shaped hollow pattern 625 and the third U-shaped hollow pattern 627; one end of the second U-shaped hollow pattern 626 is communicated with one end of the first U-shaped hollow pattern 625, and the other end thereof is communicated with one end of the third U-shaped hollow pattern 627. The sizes of the first U-shaped hollow pattern 625, the second U-shaped hollow pattern 626, and the third U-shaped hollow pattern 627 may be the same.

Figure 18:
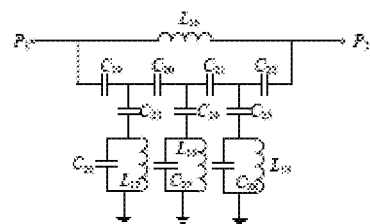
FIG. 18 is a schematic diagram of an equivalent circuit structure of an etching pattern of a defective conductor layer shown in FIG. 17 according to another embodiment of the present application.

The sixth pattern is very much like a W as a whole. It can be considered that this embodiment provides a low-pass filtering cable based on a W-type defective conductor layer. As can be seen from FIG. 17, the low-pass filtering cable based on a W-type defective conductor layer realizes the low-pass filtering function through the structure similar to W, which can realize three transmission zeros, sharp roll-off and wider stop-band characteristics. The specific parameters of the structure shown in FIG. 17 are as follows: the length of the sixth pattern in the radial direction of the filtering cable is $D_{12}$=5 mm, the length of one end of the U-shaped hollow pattern in the axial direction of the filtering cable $D_{13}$=the length of the other end of the U-shaped hollow pattern in the axial direction of the filtering cable $D_{14}$=0.2 mm, the distance between both ends of the U-shaped hollow pattern is $D_{15}$=1.4 mm, the length of the U-shaped hollow pattern in the radial direction of the filtering cable $W_{19}$=13.64 mm, the length of one end of the U-shaped hollow pattern in the radial direction of the filtering cable is $W_{21}$, and the length of the other end thereof in the radial direction of the filtering cable is $W_{20}$=7.76 mm. The structure of this embodiment can make the filtering cable equivalent to the equivalent circuit shown in FIG. 18. The equivalent circuit in FIG. 18 comprises a sixteenth inductor $L_{16}$, a seventeenth inductor $L_{17}$, a eighteenth inductor $L_{18}$, a nineteenth inductor $L_{19}$, a nineteenth capacitor $C_{19}$, a twentieth capacitor $C_{20}$, a twenty-first capacitor $C_{21}$, a twenty-second capacitor $C_{22}$, a twenty-third capacitor $C_{23}$, a twenty-fourth capacitor $C_{24}$, a twenty-fifth capacitor $C_{25}$, a twenty-sixth capacitor $C_{26}$, a twenty-seventh capacitor $C_{27}$, and a twenty-eighth capacitor $C_{28}$. The first end of the sixteenth inductor $L_{16}$ is connected to the first end of the first node $P_1$ and the nineteenth capacitor $C_{14}$, respectively, and the second end thereof is connected to the second node $P_2$ and the first end of the twenty-second capacitor $C_{22}$, respectively; the second end of the nineteenth capacitor $C_{19}$ is connected to the first end of the twentieth capacitor $C_{20}$ and the first end of the twenty-third capacitor $C_{23}$, respectively; the second end of the twentieth capacitor $C_{20}$ is connected to the first end of the twenty-first capacitor $C_{21}$ and the first end of the twenty-fourth capacitor $C_{24}$, respectively; the second end of the twenty-first capacitor $C_{21}$ is connected to the second end of the twenty-second capacitor $C_{22}$ and the first end of the twenty-fifth capacitor $C_{25}$, respectively; the second end of the twenty-third capacitor $C_{23}$ is connected to the first end of the twenty-sixth capacitor $C_{26}$ and the first end of the seventeenth inductor $L_{17}$, respectively; the second end of the twenty-fourth capacitor $C_{24}$ is connected to the first end of the twenty-seventh capacitor $C_{27}$ and the first end of the eighteenth inductor $L_{18}$, respectively; the second end of the twenty-fifth capacitor $C_{25}$ is connected to the first end of the twenty-eighth capacitor $C_{28}$ and the first end of the nineteenth inductor $L_{19}$, respectively; the second end of the twenty-sixth capacitor $C_{26}$, the second end of the seventeenth inductor $L_{17}$, the second end of the twenty-seventh capacitor $C_{27}$, the second end of the eighteenth inductor $L_{18}$, the second end of the twenty-eighth capacitor $C_{28}$ and the second end of the nineteenth inductor $L_{19}$ are grounded, respectively. The filtering performance achieved based on the above structure comprises: the transition band is from 3.11 GHz (which is the cutoff frequency) to 3.23 GHz, the insertion loss changes from −3.02 dB to −22.5 dB; the insertion loss of the stop-band is 25 dB, and the frequency band of the stop-band can be extended to 3.4 GHz (which is the cutoff frequency).

Figure 19:
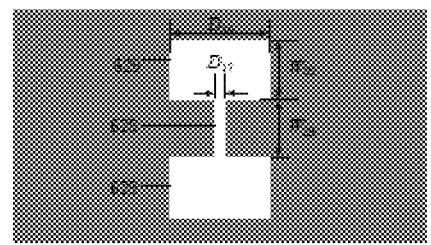
FIG. 19 is a schematic structural diagram of an etching pattern of a defective conductor layer according to another embodiment of the present application.

Structure Five:

If the value of N is 1, and the preset filter circuit comprises a low-pass filter circuit, the etching pattern comprises: a plurality of seventh patterns; as shown in FIG. 19, the seventh patterns comprise: an eleventh hollow line segment 628 in the radial direction of the filtering cable: both ends of the eleventh hollow line segment 628 are provided with a third widened hollow area 629, respectively. The length of the third widened hollow area 629 in the axial direction of the filtering cable is greater than the length of other areas of the eleventh hollow line segment 628 in the axial direction of the filtering cable, which looks like a dumbbell.

Figure 20:
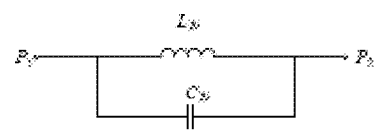
FIG. 20 is a schematic diagram of an equivalent circuit structure of an etching pattern of a defective conductor layer shown in FIG. 19 according to another embodiment of the present application.

This embodiment provides a low-pass filtering cable based on a dumbbell-shaped defective conductor layer. As can be seen from FIG. 19, in this embodiment, the low-pass filtering cable based on a dumbbell-shaped defective conductor layer realizes the low-pass filtering function through a dumbbell-like (or I-type) structure, which can realize sharp roll-off and wider stop-band characteristics. The specific parameters of the structure shown in FIG. 19 are as follows: the length of the third widened hollow region 629 in the axial direction of the filtering cable is $D_{16}$=2.5 mm, the length of the eleventh hollow line segment 628 in the axial direction of the filtering cable is $D_{17}$=0.5 mm, the length of the third widened hollow area 629 in the radial direction of the filtering cable is $W_{22}$=2.6 mm, and the length of the eleventh hollow section 628 in the radial direction of the filtering cable is $W_{23}$=2.0 mm. The structure of this embodiment can make the filtering cable equivalent to the equivalent circuit shown in FIG. 20. The equivalent circuit in FIG. 20 comprises a twentieth inductor $L_{20}$ and a twenty-ninth capacitor $C_{29}$. The first end of the twentieth inductor $L_{20}$ is connected to the first node $P_1$ and the first end of the twenty-ninth capacitor C29, respectively, and the second end thereof is connected to the second node $P_2$ and the second end of the twenty-ninth capacitor $C_{29}$, respectively. The filtering performance based on this structure comprises: the transition band is from the pass-band as DC to 4 GHz, the insertion loss is less than 0.2 dB, and the stop-band is from 4.3 GHz to 16.2 GHz.

Figure 21:
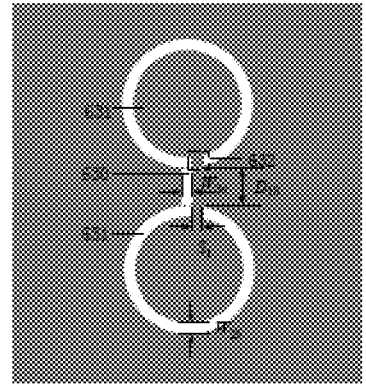
FIG. 21 is a schematic structural diagram of an etching pattern of a defective conductor layer according to another embodiment of the present application.

Structure Six:

If the value of N is 1, and the preset filter circuit comprises a band-stop filter circuit, the etching pattern comprises: a plurality of eighth patterns: as shown in FIG. 21, the eighth patterns comprise: a twelfth hollow line segment 630 in the radial direction of the filtering cable; both ends of the twelfth hollow line segment 630 are provided with a third single-ring hollow pattern 631, respectively; the third single-ring hollow pattern 631 has a non-hollow area 632 on the side close to the twelfth hollow line segment 630, wherein the third single-ring hollow pattern 631 may be, but not limited to, a ring hollow pattern.

Figure 22:
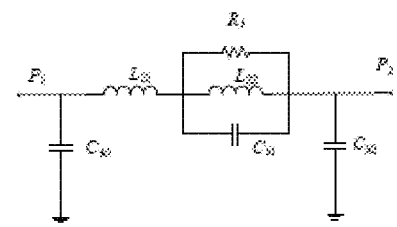
FIG. 22 is a schematic diagram of an equivalent circuit structure of an etching pattern of a defective conductor layer shown in FIG. 21 according to another embodiment of the present application.

This embodiment provides a band-stop filtering cable based on a double-ring bridge-connected defective conductor layer. As can be seen from the figure, the band-stop filtering cable based on a double-ring bridge-connected defective conductor layer realizes the band-stop filtering function through two etched ring-shaped groove and a narrow etching gap bridge-connected structure. The specific parameters of the structure of this embodiment are as follows: the length of the twelfth hollow line segment 630 in the axial direction of the filtering cable $W_{24}$=the width of the ring-shaped line of the third single-ring hollow pattern 631 $W_{25}$=0.4 mm, the length of the non-hollow area of the third single-ring hollow pattern 631 is $S_1$=0.2 mm, the radius of the outer ring of the third single-ring hollow pattern 631 is R=4 mm, and the length of the twelfth hollow line segment 630 in the radial direction of the filtering cable is $D_{18}$=2 mm. The structure of this embodiment can make the filtering cable equivalent to the equivalent circuit shown in FIG. 22. The circuit of FIG. 22 comprises a twenty-first inductor $L_{21}$, a twenty-second inductor $L_{22}$, a third resistor $R_3$, a thirty capacitor $C_{30}$, a thirty-first capacitor $C_{31}$, and a thirty-second capacitor $C_{32}$. The first end of the twenty-first inductor $L_{21}$ is connected to the first node $P_1$ and the first end of the thirtieth capacitor $C_{30}$, respectively, and the second end thereof is connected to the third resistor $R_3$, the first end of the twenty-second inductor $L_{22}$, and the first end of the thirty-first capacitor $C_{31}$, respectively: the second end of the third resistor $R_3$ is connected to the second node $P_2$, the second end of the twenty-second inductor $L_{22}$, the second end of the thirty-first capacitor $C_{31}$, and the first end of the thirty-second capacitor $C_{32}$, respectively: the second end of the thirtieth capacitor $C_{30}$, and the second end of the thirty-second capacitor $C_{32}$ are grounded, respectively. The filtering performance based on this structure comprises; in the case of a single resonance unit, obtaining the stop-band insertion loss of 1.5 GHz-1.6 GHz greater than 20 dB, and in the case of cascading, greatly improving the stop-band insertion loss. The insertion loss in the pass-band of DC-1.4 GHz, 1.7 GHz-4 GHz is small, less than 1 dB.

Figure 23:
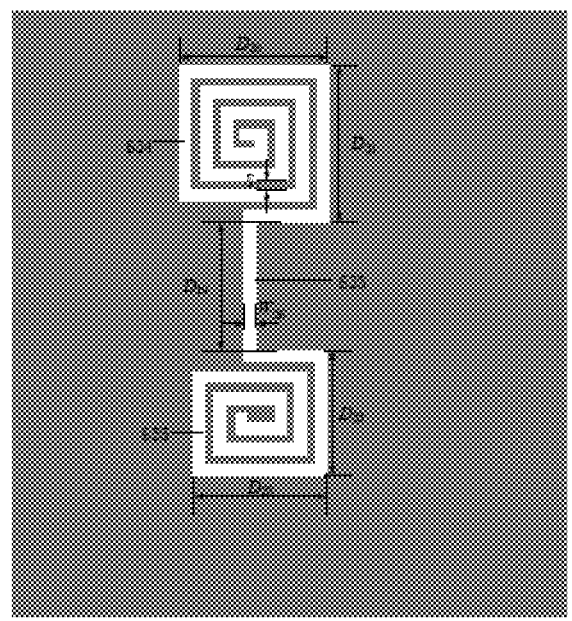
FIG. 23 is a schematic structural diagram of an etching pattern of a defective conductor layer according to another embodiment of the present application.

Structure Seven:

If the value of N is 1, and the preset filter circuit comprises a band-stop filter circuit, the etching pattern comprises: a plurality of ninth patterns; as shown in FIG. 23, the ninth patterns comprise: a thirteenth hollow line segment 633 provided in the radial direction of the filtering cable, a third spiral hollow pattern 634 is provided at one end of the thirteenth hollow line segment 633, and a fourth spiral hollow pattern 635 is provided at the other end thereof: the third spiral hollow pattern 634 is asymmetrical with the fourth spiral hollow pattern 635.

Figure 24:
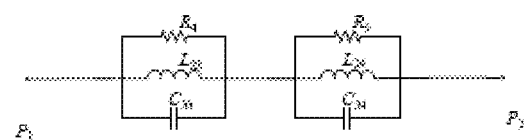
FIG. 24 is a schematic diagram of an equivalent circuit structure of an etching pattern of a defective conductor layer shown in FIG. 23 according to another embodiment of the present application.

This embodiment provides a dual-band band-stop filtering cable based on an asymmetric bridge-connected spiral defective conductor layer. As shown in FIG. 23, the band-stop filtering cable based on an asymmetric bridge-connected spiral defective conductor layer realizes the dual-band band-stop filtering function through two etched asymmetric spiral gaps and a narrow etching gap bridge-connected structure. The specific parameters of the structure shown in FIG. 23 are as follows: the length of the thirteenth hollow line segment 633 in the axial direction of the filtering cable is $W_{26}$=0.2 mm, the pitch of the third spiral hollow pattern and the pitch of the fourth spiral hollow pattern are both $S_2$=0.2 mm, the length of the thirteenth hollow section 633 in the radial direction of the filtering cable is $D_{19}$=2.4 mm, the length of the third spiral hollow pattern 634 in the axial direction of the filtering cable is $D_{20}$=3.2 mm, the length of the third spiral hollow pattern 634 in the radial direction of the filtering cable is $D_{21}$=3.0 mm, the length of the fourth spiral hollow pattern 635 in the radial direction of the filtering cable is $D_{22}$=2.4 mm, and the length of the fourth spiral hollow pattern 635 in the axial direction of the filtering cable is $D_{23}$=2.6 mm. The structure of this embodiment can make the filtering cable equivalent to the equivalent circuit shown in FIG. 24. The equivalent circuit in FIG. 24 comprises: a fourth resistor $R_4$, a fifth resistor $R_5$, a twenty-third inductor $L_{23}$, a twenty-fourth inductor $L_{24}$, a thirty-third capacitor $C_{33}$, and a thirty-fourth capacitor $C_{34}$. The first end of the fourth resistor $R_4$ is connected to the first node $P_1$, the first end of the twenty-third inductor $L_{23}$, and the first end of the thirty-third capacitor $C_{33}$, and the second end thereof is connected to the second end of the twenty-third inductor $L_{23}$, the second end of the thirty-third capacitor $C_{33}$, the first end of the fifth resistor $R_5$, the first end of the twenty-fourth inductor $L_{24}$, and the first end of the thirty-fourth capacitor $C_{34}$; the second end of the fifth resistor $R_5$ is connected to the second end of the twenty-fourth inductor $L_{24}$, the second end of the thirty-fourth capacitor $C_{34}$, and the second node $P_2$. The filtering performance based on this structure comprises: in the case of a single resonance unit, obtaining two stop-bands of 3.0 GHz and 4.5 GHz with the insertion loss of the stop-band greater than 20 dB, and in the case of cascading, greatly improving the stop-band insertion loss. The insertion loss in the pass-band of DC-2.7 GHz, 3.2 GHz-4.3 GHz, and 4.7 GHz-6 GHz is small, less than 1 dB.

Figure 25:
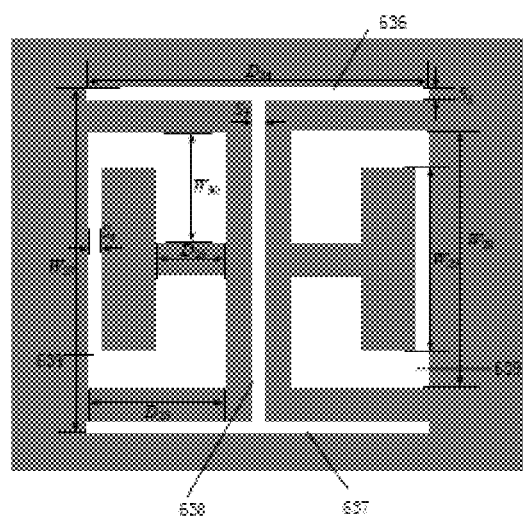
FIG. 25 is a schematic structural diagram of an etching pattern of a defective conductor layer according to another embodiment of the present application.

Structure Eight:

If the value of N is 1, and the preset filter circuit comprises a band-stop filter circuit, the etching pattern comprises: a plurality of tenth patterns; as shown in FIG. 25, the tenth patterns comprise: a fourteenth hollow line segment 636 and a fifteenth hollow line segment 637 spaced side by side in the axial direction of the filtering cable; a sixteenth hollow line segment 638 provided between the fourteenth hollow line segment 636 and the fifteenth hollow line segment 637 in the radial direction of the filtering cable; the middle of the fourteenth hollow line segment 636 is communicated with the middle of the fifteenth hollow line segment 637 through the sixteenth hollow line segment 638; a third single-ring hollow pattern 639 is provided between the fourteenth hollow line segment 636 and the fifteenth hollow line segment 637 and at both sides of the sixteenth hollow line segment 638; the middle of the side of the third single-ring hollow pattern 639 close to the sixteenth hollow line segment 638 is provided with a non-hollow area.

The tenth pattern is very much like a symmetrical H and two Cs. It can be considered that this embodiment provides a band-stop filtering cable based on a symmetrical H and C-shaped defective conductor layer, as shown in FIG. 25, the band-stop filtering cable based on a symmetrical H and C-shaped defective conductor layer is closely placed between two opposing C-shaped gaps through an H-shaped gap, forming a mutually coupled resonator to realize the band-stop filtering function, which can significantly reduce the common mode noise without affecting the differential signal. The specific parameters of the structure shown in FIG. 25 are as follows: the lengths of the fourteenth hollow line segment 636 and the fifteenth hollow line segment 637 in the radial direction of the filtering cable are both $D_{24}$=6.375 mm, the length of the third single-ring hollow pattern 639 in the radial direction of the filtering cable is $D_{25}$=2.55 mm, the length of the side of the third single-ring hollow pattern 639 close to the sixteenth hollow line segment 638 in the axial direction of the filtering cable is $D_{26}$=1.275 mm, the length of the tenth pattern in the radial direction of the filtering cable is $W_{27}$=6.375 mm, the length of the outer ring of the third single-ring hollow pattern 639 in the radial direction of the filtering cable is $W_{28}$=4.76 mm, the length of the inner ring of the third single-ring hollow pattern 639 in the radial direction of the filtering cable is $W_{29}$=3.4 mm, the distance between the non-hollow area of the third single-ring hollow pattern 639 and the non-hollow area of the side of the fourteenth hollow line segment 636 close to the third single-ring hollow pattern 639 is $W_{30}$=2.04 mm, the length of the sixteenth hollow line segment 638 in the radial direction of the filtering cable is $S_3$=0.255 mm, the length of the side of the third single-ring hollow pattern 639 away from the sixteenth hollow line segment 638 in the axial direction of the filtering cable is $S_4$=0.3 mm, the length of the fourteenth hollow line segment 636 and the fifteenth hollow line segment in the radial direction of the filtering cable is $S_5$=0.2 mm. The filtering performance based on this structure comprises: in the case of a single resonance unit, obtaining a stop-band with the center frequency of 8.4 GHz, the cutoff frequency of 6.2 GHz, and the bandwidth of 73.8%. The common mode insertion loss in the stop-band is not less than 15 dB, and the differential mode insertion loss is not more than 3 dB.

Figure 26:
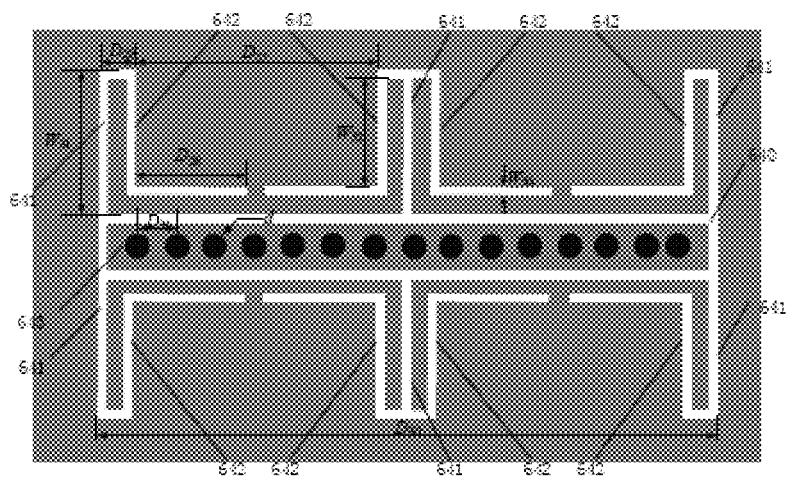
FIG. 26 is a schematic structural diagram of an etching pattern of a defective conductor layer according to another embodiment of the present application.

Structure Nine:

If the value of N is 1, and the preset filter circuit comprises a band-stop filter circuit, the etching pattern comprises: a plurality of eleventh patterns; as shown in FIG. 26, the eleventh patterns comprise: a rectangular fourth single-ring hollow pattern 640; one pair of sides of the fourth single-ring hollow pattern 640 are provided in the radial direction of the filtering cable, and the other pair of sides thereof is provided in the axial direction of the filtering cable; a seventeenth hollow line segment 641 is provided outside the fourth single-ring hollow pattern, and at both ends of and the middle of one pair of sides provided in the axial direction of the filtering cable, respectively; one end of the seventeenth hollow line segment 641 is communicated with the fourth single-ring hollow pattern 640; two symmetric L-shaped hollow patterns 642 are provided between the two seventeenth hollow line segments 641; the corner of the L-shaped hollow pattern 642 is close to the fourth single-ring hollow pattern, one side thereof is close to the seventeenth hollow line segment 641, is provided in the radial direction of the filtering cable, and is communicated with the close seventeenth hollow line segment 641 through the hollow line segment which is provided in the axial direction of the filtering cable, and the other side thereof is close to the fourth single-ring hollow pattern 640 and is provided in the axial direction of the filtering cable: the area of the core wire corresponding to the fourth single-ring hollow pattern 640 is provided with a through-hole 643 in the radial direction of the filtering cable.

This embodiment provides a band-stop filtering cable based on a symmetric L-shaped defective conductor layer. As shown in FIG. 26, the band-stop filtering cable based on a symmetric L-type defective conductor layer realizes the band-stop filtering function in such a way that 4 pairs of L-shaped gaps symmetrically distributed about the center line form mutually coupled resonators. In order to obtain a better band-stop response, the cable core is used to realize the band-stop characteristic through electromagnetic coupling, but the coupling is very weak. Therefore, in order to increase the coupling between the cable core wire and the defective conductor layer, a periodic metal via connection is introduced to produce an improved coupling between the core wire and the defective conductor layer, thus forming a good band stop filtering cable. The specific parameters of the structure shown in FIG. 26 are as follows: the distance between two L-shaped hollow patterns 642 close to one side of the seventeenth hollow line segment 641 is $D_{27}$=6.4 mm, the length of one side of the L-shaped hollow pattern 642 close to the fourth single-ring hollow pattern 640 in the axial direction of the filtering cable is $D_{28}$=2.9 mm: the length of the hollow line segment connecting the L-shaped hollow pattern 642 and the seventeenth hollow line segment 641 in the axial direction of the filtering cable is $D_{29}$=0.9 mm, the length of the eleventh pattern in the axial direction of the filtering cable is $D_{30}$=15.8 mm, the distance between the centers of the two through holes is $D_{31}$=1.0 mm, the length of the seventeenth hollow line segment is $W_{31}$=3.7 mm, the length of one side of the L-shaped hollow pattern 642 close to the seventeenth hollow line segment 641 in the radial direction of the filtering cable is $W_{32}$=2.6 mm, the length of one side of the L-shaped hollow pattern 642 close to the fourth single-ring hollow pattern 640 in the radial direction of the filtering cable is $W_{33}$=0.2 mm, and the diameter of the through hole is d=0.5 mm. The filtering performance based on this structure comprises: in the case of a single resonance unit, obtaining an insertion loss of 57.1 dB at 4.64 GHz, 42.6 dB at 5.48 GHz, and 36.8 dB at 6.16 GHz. In the low-pass band, the maximum insertion loss from 0.2 to 3.35 GHz is 0.5 db. In the high-pass band, the maximum insertion loss from 6.89 to 7.98 GHz is 2.0 db, and the maximum insertion loss from 8.12 to 10.8 GHz is 1.0 db. In addition, in the stop-band, the attenuation of 4.56-6.29 GHz is higher than 28.5 dB. For Return Loss (RL), there are three reflection poles in the lower-pass band, comprising a near DC operating point, 3.22 GHz, 3.84 GHz, and RL is better than 13 dB between 0.2 and 4.01 GHz. In the upper-pass band, there are three reflection poles of 6.91, 8.55, and 10.61 GHz, and RL is better than 7.5 dB in the range of 6.75 to 11.36 GHz.

Figure 27:
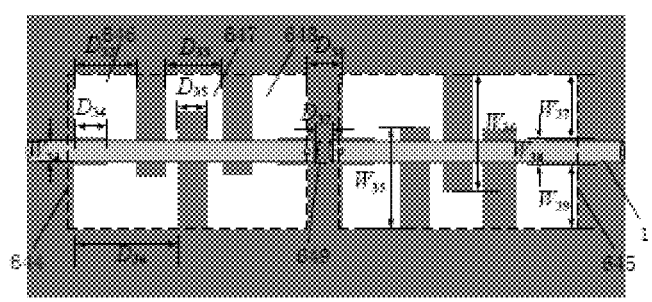
FIG. 27 is a schematic structural diagram of an etching pattern of a defective conductor layer according to another embodiment of the present application.

Structure Ten:

If the value of N is 1, and the preset filter circuit comprises a band-pass filter circuit, the etching pattern comprises: a plurality of twelfth patterns; as shown in FIG. 27, the twelfth patterns comprise: a first sub-pattern 644 and a second sub-pattern 645 spaced from each other; the first sub-pattern 644 of the twelfth pattern comprises: a fourth U-shaped hollow pattern 646, a fifth U-shaped hollow pattern 647 and a sixth U-shaped hollow pattern 648, which are sequentially provided; the openings of the fourth U-shaped hollow pattern, the fifth U-shaped hollow pattern and the sixth U-shaped hollow pattern are provided in the radial direction of the filtering cable; wherein the opening direction of the fifth U-shaped hollow pattern is opposite to the opening direction of the fourth U-shaped hollow pattern and the sixth U-shaped hollow pattern; one end of the fifth U-shaped hollow pattern is communicated with one end of the fourth U-shaped hollow pattern, and the other end thereof is communicated with one end of the sixth U-shaped hollow pattern; the second sub-pattern 645 of the twelfth pattern is a pattern obtained in such a way that the first sub-pattern 644 of the twelfth pattern rotates by 180 degrees in the radial direction of the filtering cable: the area of the core wire 1 corresponding to the interval between the first sub-pattern 643 and the second sub-pattern 644 of the twelfth pattern is provided with a first cut-off area 649; the first cut-off area 648 is filled with a first dielectric (not shown in the figure); the boundary of the first sub-pattern 644 and the second sub-pattern 645 of the twelfth pattern corresponding to the core wire 1 is provided with a non-hollow area; the core wires 1 on both sides of the first cut-off region 649 are connected with the defective conductor layer.

Figure 28:
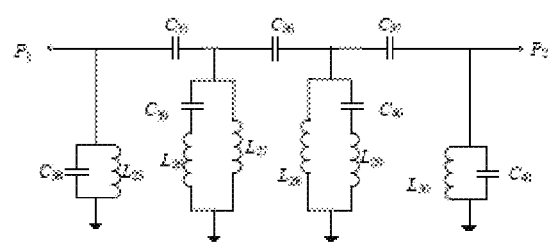
FIG. 28 is a schematic diagram of an equivalent circuit structure of an etching pattern of a defective conductor layer shown in FIG. 27 according to another embodiment of the present application.

As can be seen from FIG. 27, this embodiment provides a band-pass filtering cable based on an interdigital defective conductor layer. As shown in FIG. 27, the structure of the band-pass filtering cable based on the interdigital defective conductor layer mainly consists of four parts, namely a core wire (being cutoff), a dielectric filling layer (that is, the above first dielectric), a connecting channel between the core wire and the defective conductor layer (indicated by dots in the figure), and an interdigital defective structure on the defective conductor layer, and may also be a multilayer structure. The specific parameters of the structure shown in FIG. 27 are as follows: the length of the end of the fourth U-shaped hollow pattern 646 and the sixth U-shaped hollow pattern 648 that are not in communication with the fifth U-shaped hollow pattern 647 in the axial direction of the filtering cable is $D_{32}=4$ mm, the length of the bottom of the five U-shaped hollow patterns 647 in the axial direction of the filtering cable is $D_{33}=4$ mm, the length of the non-hollow area corresponding to the core wire 1 at the end of the fourth U-shaped hollow pattern 646 and the sixth U-shaped hollow pattern 648 that are not in communication with the fifth U-shaped hollow pattern 647 in the axial direction of the filtering cable is $D_{34}=2$ mm, the distance between two ends of the fourth U-shaped hollow pattern 646, the fifth U-shaped hollow pattern 647 and the sixth U-shaped hollow pattern 648 is $D_{35}=2$ mm, the length of the bottom of the fourth U-shaped hollow pattern 646 and the sixth U-shaped hollow pattern 648 in the axial direction of the filtering cable is $D_{36}=7$ mm, the length of the first cut-off area in the axial direction of the filtering cable is $D_{37}=1$ mm, the distance between the first sub-pattern 644 and the second sub-pattern 645 is $D_{38}=2.4$, the diameter of the core wire is $W_{34}=2$ mm, the depth of the U-shaped opening of the fourth U-shaped hollow pattern 646 and the sixth U-shaped hollow pattern 648 is $W_{35}=7.6$ mm, the depth of the U-shaped opening of fifth U-shaped hollow pattern 647 is $W_{36}=8.7$ mm, the distance between the bottom of the fourth U-shaped hollow pattern 646 and the sixth U-shaped hollow pattern 648 and the non-hollow area corresponding to the core wire is $W_{37}=2.2$ mm, the length of the non-hollow area corresponding to the core wire in the radial direction of the filtering cable is $W_{38}=5$ mm, the distance between the end of the fourth U-shaped hollow pattern 646 and the sixth U-shaped hollow pattern 648 and the non-hollow area corresponding to the core wire is $W_{39}=5$ mm. The structure of this embodiment can make the filtering cable equivalent to the equivalent circuit shown in FIG. 28. The circuit in FIG. 28 comprises: a thirty-fifth capacitor $C_{35}$, a thirty-sixth capacitor $C_{36}$, a thirty-seventh capacitor $C_{37}$, a thirty-eighth capacitor $C_{38}$, a thirty-ninth capacitor $C_{39}$, a fortieth capacitor $C_{40}$, a forty-first capacitor $C_{41}$, a twenty-fifth inductor $L_{25}$, a twenty-sixth inductor $L_{26}$, a twenty-seventh inductor $L_{27}$, a twenty-eighth inductor $L_{28}$, a twenty-ninth inductor $L_{29}$, and a thirty inductor $L_{30}$. The thirty-fifth capacitor $C_{35}$ is connected to the first end of the first node $P_1$, the thirty-eighth capacitor $C_{38}$, and the first end of the twenty-fifth inductor $L_{25}$, respectively; the second end thereof is connected to the first end of the thirty-sixth capacitor $C_{36}$, the first end of the thirty-ninth capacitor $C_{39}$, and the first end of the twenty-seventh inductor $L_{27}$, respectively; the second end of the thirty-ninth capacitor $C_{39}$ is connected to the first end of the twenty-sixth inductor $L_{26}$; the second end of the thirty-sixth capacitor $C_{36}$ is connected to the first end of the twenty-eighth inductor $L_{28}$, the first end of the thirty-seventh capacitor $C_{37}$, and the first end of the fortieth capacitor $C_{40}$, respectively; the fortieth capacitor $C_{40}$ is connected to the first end of the twenty-ninth inductor $L_{29}$; the second end of the thirty-seventh capacitor $C_{37}$ is connected to the second node $P_2$, the first end of the thirtieth inductor $L_{30}$, and the first end of the forty-first capacitor $C_{41}$, respectively; the second end of the thirty-eighth capacitor $C_{38}$, the second end of the twenty-fifth inductor $L_{25}$, the second end of the twenty-sixth inductor $L_{26}$, the second end of the twenty-seventh inductor $L_{27}$, the second end of the twenty-eighth inductor $L_{28}$, the second end of the twenty-ninth inductor $L_{29}$, the second end of the thirty inductor $L_{30}$, and the second end of the forty-first capacitor $C_{41}$ are grounded, respectively. The filtering performance based on this structure comprises: in the case of a single resonance unit, having band-pass filtering performance with a center frequency of 2.5 GHz and a bandwidth of 14.8%, and having the advantages of high selectivity and wide upper stop-band. For many communication applications that require high selectivity and a wide stop-band, it may be a potential band-pass application.

Figure 29:
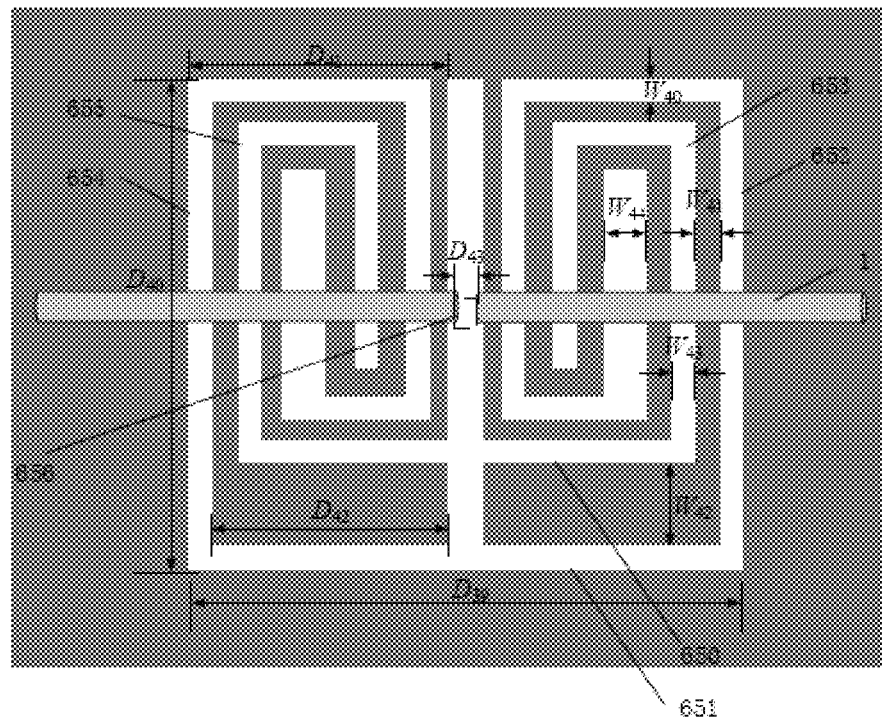
FIG. 29 is a schematic structural diagram of an etching pattern of a defective conductor layer according to another embodiment of the present application.

Structure Eleven:

If the value of N is 1, and the preset filter circuit comprises a band-pass filter circuit, the etching pattern comprises: a plurality of thirteenth patterns; as shown in FIG. 29, the thirteenth patterns comprise: a ±-shaped hollow pattern; the first vertical side of the ±-shaped hollow pattern is provided in the radial direction of the filtering cable, the first horizontal side 650 and the second horizontal side 651 are provided in the axial direction of the filtering cable, respectively; the length of the first horizontal side 650 is shorter than the length of the second horizontal side 651: one end of the second horizontal side 651 is provided with a fifth spiral hollow pattern 652, and the other end thereof is provided with a sixth spiral hollow pattern 654 completely symmetrical with the fifth spiral hollow pattern 652; one end of the first horizontal side 650 is provided with a seventh spiral hollow pattern 653, the seventh spiral hollow pattern 653 is located in the non-hollow area of the fifth spiral hollow pattern 652, and the other end thereof is provided with an eighth spiral hollow pattern 655 completely symmetrical with the seventh spiral hollow pattern 653, the eighth spiral hollow pattern 655 is located in the non-hollow area of the sixth spiral hollow pattern 654; the area of the core wire 1 corresponding to the vertical side of the ±-shaped hollow pattern is provided with a second cut-off area 656, and the second cut-off area 656 is filled with a second dielectric (not shown in the figure).

This embodiment provides a band-pass filtering cable based on a defective conductor layer of a zigzag linear multimode resonance unit. As shown in FIG. 29, the structure of a band-pass filtering cable based on a defective conductor layer of a zigzag linear multimode resonance unit mainly consists of three parts, namely the core wire (being cutoff), the dielectric filling layer (that is, the above second dielectric), and the defective conductor layer (whose structure is considered to comprise a number of zigzag linear multimode resonance units). The specific parameters of the structure shown in FIG. 29 are as follows: the length of the first horizontal side in the axial direction of the filtering cable is $D_{39}=7$ mm, the length of the thirteenth pattern in the radial direction of the filtering cable is $D_{40}=6.2$ mm, the length of the fifth spiral hollow pattern 652 and the sixth spiral hollow pattern 654 in the axial direction of the filtering cable is $D_{41}=3.3$ mm, the length of the non-hollow area surrounded by the second horizontal side, the first horizontal side, and the first vertical side of the ±-shaped hollow pattern in the axial direction of the filtering cable is $D_{42}=3$ mm, the length of the second cut-off region 656 in the axial direction of the filtering cable is $D_{43}=1$ mm, the width of the hollow lines of the fifth spiral hollow pattern and the sixth spiral hollow pattern other than the ends is $W_{40}=0.3$ mm, the distance between the hollow line segment in the fifth spiral hollow pattern and the hollow line segment in the seventh spiral hollow pattern and the distance between the hollow line segment in the sixth spiral hollow pattern and the hollow line segment in the eighth spiral hollow pattern in the axial direction of the filtering cable are $W_{41}=0.3$ mm, the distance between the first horizontal side and the second horizontal side is $W_{42}=0.6$ mm, the width of the hollow line in the seventh spiral hollow pattern and the eighth spiral hollow pattern is $W_{43}=0.3$ mm, and the width of the hollow line of the end of the fifth spiral hollow pattern and the sixth spiral hollow pattern is $W_{44}=0.3$ mm. The filtering performance based on this structure comprises: in the case of a single resonance unit, generating two pass-bands and four transmission zeros. The typical case is as follows, the dual-band pass filter operates at 2.45 GHz and 5.8 GHz (WLAN application), the bandwidth is 12.8% and 14.7%, respectively, and the minimum insertion loss is 1.1 dB and 1.0 dB. The resulting four transmission zeros can improve selectivity.

Figure 30:
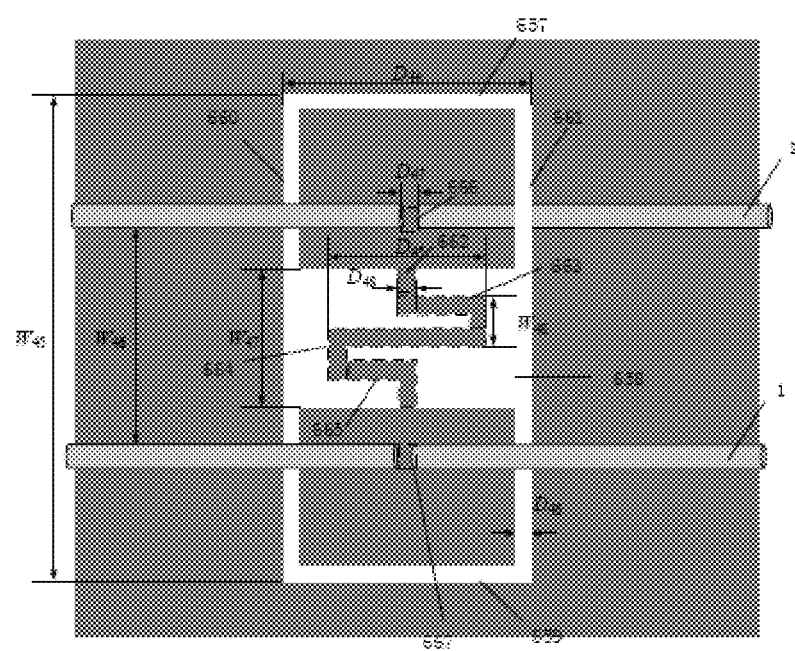
FIG. 30 is a schematic structural diagram of an etching pattern of a defective conductor layer according to another embodiment of the present application.

Structure 12:

If the value of N is 1, the preset filter circuit comprises a band-pass filter circuit, and the number of core wires is 2, the etching pattern comprises: a plurality of fourteenth patterns; as shown in FIG. 30, the fourteenth patterns comprise: a θ-shaped hollow pattern; and the θ-shaped hollow pattern comprises a third horizontal side 657, a fourth horizontal side 658 and a fifth horizontal side 659 provided in the axial direction of the filtering cable, and a second vertical side 660 and a third vertical side 661 provided in the radial direction of the filtering cable; the fourth horizontal side 658 is located between the third horizontal side 657 and the fifth horizontal side 659; the middle of the side of the fourth horizontal side 658 close to the third horizontal side 657 is provided with a non-hollow line segment 662 provided in the radial direction of the filtering cable; the fourth horizontal side 658 is further provided with a first L-shaped non-hollow area 663, a second L-shaped non-hollow are 664, and a third L-shaped non-hollow area 665 with a long side in the axial direction of the filtering cable; the long side of the first L-shaped non-hollow area 663 is communicated with the non-hollow line segment 662, and the short side thereof is communicated with the long side of the second L-shaped non-hollow area 664, the short side of the second L-shaped non-hollow area 664 is communicated with the long side of the third L-shaped non-hollow are 665; one of the two core wires 1 is located in the non-hollow area between the third horizontal side 657 and the fourth horizontal side 658 and is provided with a third cut-off area 666, and the other core wire 1 is located in the non-hollow area between the third horizontal side 658 and the fifth horizontal side 659, and is provided with a fourth cut-off area 667; the third cut-off area is filled with a third dielectric; and the fourth cut-off area is filled with a fourth dielectric.

Figure 31:
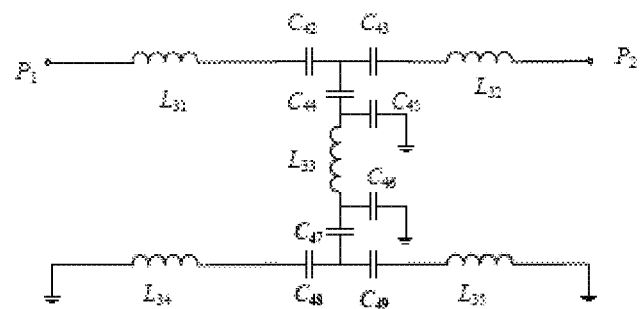
FIG. 31 is a schematic diagram of an equivalent circuit structure of an etching pattern of a defective conductor layer shown in FIG. 30 according to another embodiment of the present application.

The fourteenth pattern also looks like a dumbbell. It can be considered that this embodiment provides a differential band-pass filtering cable based on a dumbbell-shaped defective conductor layer. As shown in FIG. 30, the structure of the differential band-pass filtering cable based on a dumbbell-shaped defective conductor layer consists of a dumbbell-shaped differential transmission line. The non-hollow area surrounded by the hollow appears to be formed in such a way that two capacitive square patches are connected to each other through a thin metal strip. In this structure, the resonance unit will be excited in the case of a differential mode signal, and the vertical component of the electric field of the transmission line in the differential mode signal transmission is reversed. This will create an electric dipole moment at the top and bottom of the resonance unit, thereby generating current in the metal strip between the resonance units. However, in the case of common mode transmission, the electric field of the transmission line also excites the capacitive patches on the top and bottom, so there is no dipole moment and current on the metal strip, and the resonance unit cannot be excited. The specific parameters of the structure of FIG. 30 are as follows: the length of the third horizontal side in the axial direction of the filtering cable is $D_{44}=7.6$ mm, the length of the long side of the second L-shaped non-hollow area 664 in the axial direction of the filtering cable is $D_{45}=4.2$ mm, and the length of the second vertical side and the third vertical side in the axial direction of the filtering cable is $D_{46}=0.2$ mm, the length of the third cut-off area and the fourth cut-off area is $D_{47}=0.6$ mm, the length of the non-hollow area 662 in the axial direction of the filtering cable is $D_{48}=0.4$ mm, the length of the fourteenth pattern in the radial direction of the filtering cable is $W_{45}=15.4$ mm, the distance between the two core wires 1 is $W_{46}=5.7$ mm, the length of the fourth horizontal side in the radial direction of the filtering cable is $W_{47}=4.2$ mm, and the length of the short side of the first L-shaped non-hollow region 663 plus the long side of the second L-shaped non-hollow region 664 in the radial direction of the filtering cable is $W_{48}=1.4$ mm. The structure of this embodiment can make the filtering cable equivalent to the equivalent circuit shown in FIG. 31. The equivalent circuit in FIG. 31 comprises: a thirty-first inductor $L_{31}$, a thirty-second inductor $L_{32}$, a thirty-third inductor $L_{33}$, a thirty-fourth inductor $L_{34}$, a thirty-fifth inductor $L_{35}$, a forty-second capacitor $C_{42}$, a forty-third capacitor $C_{43}$, a forty-fourth capacitor $C_{44}$, a forty-fifth capacitor $C_{45}$, a forty-sixth capacitor $C_{46}$, a forty-seventh capacitor $C_{47}$, a forty-eighth capacitor $C_{48}$, and a forty-ninth capacitor $C_{49}$. The first end of the thirty-first inductor $L_{31}$ is connected to the first node $P_1$, the second end is connected to the first end of the forty-second capacitor $C_{42}$; the second end of the forty-second capacitor $C_{42}$ is connected to the first end of the forty-third capacitor $C_{43}$ and the first end of the forty-fourth capacitor $C_{44}$, respectively: the second end of the forty-third capacitor $C_{43}$ is connected to the first end of the thirty-second inductor $L_{32}$ the second end of the thirty-second inductor $L_{32}$ is connected to the second node $P_2$; the second end of the forty-fourth capacitor $C_{44}$ is connected to the first end of the forty-fifth capacitor $C_{45}$ and the first end of the thirty-third inductor $L_{33}$, respectively; the second end of the thirty-third inductor $L_{33}$ is connected to the first end of the forty-sixth capacitor $C_{46}$ and the first end of the forty-seventh capacitor $C_{47}$, respectively; the second end of the forty-seventh capacitor $C_{47}$ is connected to the first ends of the forty-eighth capacitor $C_{48}$ and the forty-ninth capacitor $C_{49}$, respectively: the second end of the forty-eighth capacitor $C_{48}$ is connected to the first end of the thirty-fourth inductor $L_{34}$, the second end of the forty-ninth capacitor $C_{49}$ is connected to the first end of the thirty-fifth inductor $L_{35}$, and the second end of the forty-fifth capacitor $C_{45}$, the second end of the forty-sixth capacitor $C_{46}$, the second end of the thirty-fourth inductor $L_{34}$, and the second end of the thirty-fifth inductor $L_{35}$ are grounded, respective. The differential band-pass filtering cable based on a dumbbell-shaped defective conductor layer can achieve a high-order band-pass filtering function. A typical third-order filtering cable has a relative bandwidth of 6% at a center frequency of 1.5 GHz. The insertion loss of the pass-band differential mode signal is 2.4 dB. The typical third-order filtering cable can be improved by choosing a better flexible substrate material, so as to obtain a lower insertion loss. There is more than 57 dB of common mode rejection in the differential pass-band. The minute pass-band of the common mode signal is caused by asymmetry resulted from manufacturing tolerances. The common mode pass-band can be reduced by improving the processing accuracy.

Figure 32:
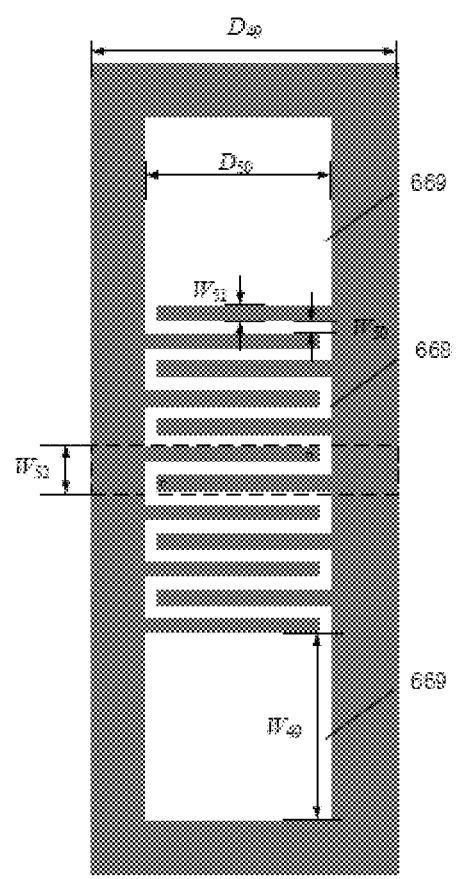
FIG. 32 is a schematic structural diagram of an etching pattern of a defective conductor layer according to another embodiment of the present application.
Figure 33:
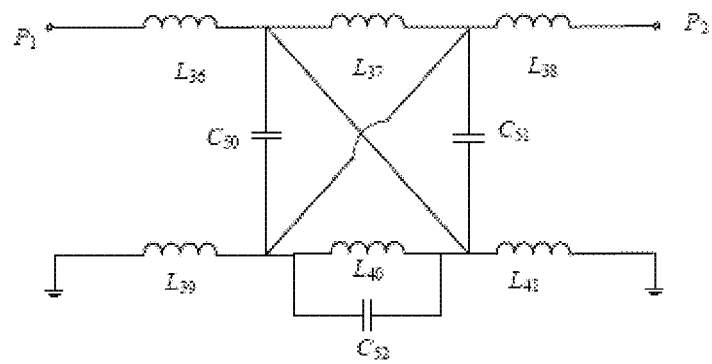
FIG. 33 is a schematic diagram of an equivalent circuit structure of an etching pattern of a defective conductor layer shown in FIG. 31 according to another embodiment of the present application.

Structure 13:

If the value of N is 1, and the preset filter circuit comprises a band-pass filter circuit, the etching pattern comprises: a plurality of fifteenth patterns; as shown in FIG. 32, the fifteenth patterns comprise: a square wave hollow patter 668; both ends of the square wave hollow pattern are provided with a fourth widened hollow area 669 in the radial direction of the filtering cable, respectively. The square wave hollow pattern looks very zigzag. It can be considered that this embodiment provides a defective conductor layer band-pass filtering cable based on a zigzag linear dumbbell structure. As shown in FIG. 32, the structure of the defective conductor layer band-pass filtering cable based on a zigzag linear dumbbell structure consists of a zigzag linear dumbbell-shaped structure, a cable core and a connecting channel between the core wire and the defective conductor layer (indicated by dots in the figure). As seen from the figure, the resonance unit based on a zigzag linear dumbbell structure is formed in such a way that two square gaps and a zigzag linear gap are connected to each other. The bridge between the through-via and the defective conductor layer makes the equivalent inductance and capacitance components negative. These negative components exclude a parasitic right-hand branch, so the transmission line has only a pure left-hand branch response characteristic. As shown in FIG. 32, two connecting channels with a radius of 0.3 mm are connected to the cable core on the zigzag linear interdigital line. The specific parameters of the structure shown in FIG. 32 are as follows: the length of the fourteenth pattern in the axial direction of the filtering cable is $D_{49}$=5.2 mm, the length of the square wave hollow pattern 668 in the axial direction of the filtering cable is $D_{50}$=5 mm, the length of the fourth widened hollow area 669 in the radial direction of the filtering cable is $W_{49}$=5 mm, the square wave line width of the square wave hollow pattern 668 is $W_{50}$=0.1 mm, the square wave interval of the square wave hollow pattern 668 is $W_{51}$=0.5 mm, and the period of the square wave hollow pattern 668 is $W_{52}$=1.1 mm. The structure of this embodiment can make the filtering cable equivalent to the equivalent circuit shown in FIG. 32. The equivalent circuit in FIG. 32 comprises: a thirty-sixth inductor $L_{36}$, a thirty-seventh inductor $L_{37}$, a thirty-eighth inductor $L_{38}$, a thirty-ninth inductor $L_{39}$, a fortieth inductor $L_{40}$, a forty-first inductor $L_{41}$, a fiftieth capacitor $C_{50}$, a fiftieth-first capacitor $C_{51}$, and a fiftieth-second capacitor $C_{52}$. The first end of the thirty-sixth inductor $L_{36}$ is connected to the first node $P_1$; the second end of the thirty-sixth inductor $L_{36}$ is connected to the first end of the thirty-seventh inductor $L_{37}$, the first end of the fiftieth capacitor $C_{50}$, the first end of the forty-first inductor $L_{41}$, the first end of the fortieth inductor $L_{40}$, the first end of the fifty-first capacitor $C_{51}$, and the first end of the fifty-second capacitor $C_{52}$, respectively: the second end of the thirty-seventh inductor $L_{37}$ is connected to the first end of the thirty-eighth inductor $L_{38}$, the second end of the fiftieth capacitor $C_{50}$, the second end of the fiftieth-first capacitor $C_{51}$, the first end of the thirty-ninth inductor $L_{39}$, the second end of the fortieth inductor $L_{40}$ and the second end of the fifty-second capacitor $C_{52}$, respectively; the second end of the thirty-eighth inductor $L_{38}$ is connected to the second node; the second end of the thirty-ninth inductor $L_{39}$ and the second end of the forty-first inductor $L_{41}$ are grounded, respectively. The filtering performance based on this structure comprises: the filtering bandwidth of 0.624-3.51 GHz. That is, a band-pass filtering cable with a relative bandwidth of 140% is realized.

Figure 34:
FIG. 34 is a schematic structural diagram of an etching pattern of a defective conductor layer according to another embodiment of the present application.
Figure 35:
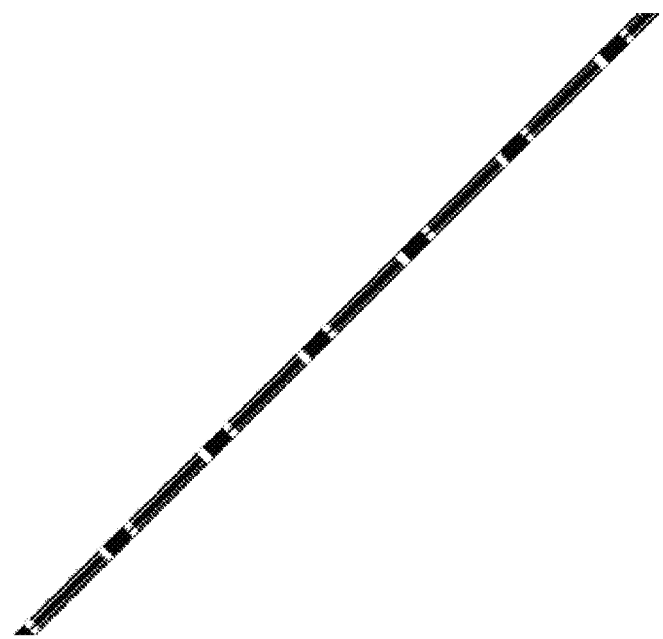
FIG. 35 is a schematic structural diagram of an etching pattern of a defective conductor layer according to another embodiment of the present application.

In some embodiments, a typical implementation of the defective conductor layer is as follows: the defective conductor layer is provided in a wound form. Specifically, it can be achieved by winding a defective conductor layer outside the insulating layer, as shown in the filtering cable based on the defective conductor layer shown in FIG. 34. The etching pattern comprises: a plurality of sixteenth patterns. There are various specific structures of the sixteenth pattern. For example, the sixteenth pattern may refer to the PI-shaped hollow pattern shown in FIG. 12. As shown in FIG. 35, the defective conductor layer of the PI-shaped hollow pattern is wound around the insulating layer at a certain angle, which can make the filtering cable equivalent to a low-pass filter circuit. In this embodiment, the defective conductor layer is wrapped around the outer side of the cable by winding, which is convenient for industrial mass production.

In the description of this specification, the description referring to the terms such as "one embodiment", "some embodiments", "examples", "specific examples", or "some examples" indicates that specific features, structures, materials, or characteristics described in conjunction with the embodiment or examples are included in at least one embodiment or example of the present application. In this specification, the schematic expression of the above terms does not necessarily refer to the same embodiment or example. Moreover, the specific features, structures, materials, or characteristics described may be combined in any suitable manner in any one or more embodiments or examples.

Although the embodiments of the present application have been shown and described above, it can be understood that the above embodiments are exemplary and cannot be construed as limitations to the present application. Changes, modifications, substitutions and variations may be made to the above embodiments by those skilled in the art within the scope of this application.

What is claimed is:

1. A filtering cable, wherein a core wire and N defective conductor layers surrounding the core wires are sequentially provided from inside to outside in the cross section in the radial direction of the filtering cable; wherein the defective conductor layer has an etching pattern; the etching pattern is distributed in the axial direction of the filtering cable; the etching pattern is used to make the filtering cable equivalent to a preset filter circuit to filter the signal transmitted in the filtering cable; where the value of N is a positive integer.

2. The filtering cable according to claim 1, wherein the etching pattern is periodically or non-periodically distributed in the axial direction of the filtering cable.

3. The filtering cable according to claim 1, wherein the etching area of the etching pattern is hollow or filled with insulating material.

4. The filtering cable according to claim 1, wherein if the value of N is greater than or equal to 2, the N defective conductor layers are insulated from or connected with each other.

5. The filtering cable according to claim 1, wherein if the value of N is 1, the etching pattern comprises: a plurality of first patterns;

the first patterns comprise: a first hollow line segment provided in the radial direction of the filtering cable, one end of the first hollow line segment is provided with a first spiral hollow pattern, and the other end is provided with a second spiral hollow pattern;

the second spiral hollow pattern and the first spiral hollow pattern are provided symmetrically.

6. The filtering cable according to claim 1, wherein if the value of N is 1, the etching pattern comprises: a plurality of second patterns;

the second patterns comprise: a first double-ring hollow pattern and a second double-ring hollow pattern spaced from each other;

the first double-ring hollow pattern and the second double-ring hollow pattern are symmetrical and the axis of symmetry is provided in the radial direction of the filtering cable;

the first double-ring hollow pattern and the second double-ring hollow pattern have a first non-hollow area at the middle of the side of the outer ring close to the axis of symmetry;

the first double-ring hollow pattern and the second double-ring hollow pattern have a second non-hollow area at the middle of the side of the inner ring away from the axis of symmetry.

7. The filtering cable according to claim 1, wherein the preset filter circuit comprises a low-pass filter circuit, a band-stop filter circuit or a band-pass filter circuit.

8. The filtering cable according to claim 7, wherein if the value of N is 1, and the preset filter circuit comprises a low-pass filter circuit;

the etching pattern comprises: a plurality of third patterns; the third patterns comprise: a second hollow line segment in the axial direction of the filtering cable; the second hollow line segment comprises a third hollow line segment, a fourth hollow line segment and a fifth hollow line segment which are symmetrical at both ends of the third hollow line segment and in which the axis of symmetry is provided along the diameter of the filtering cable;

a sixth hollow line segment that is spaced side by side with the second hollow line segment; an area on the sixth hollow line segment corresponding to the third hollow line segment has a third non-hollow area, the area on the sixth hollow line segment corresponding to the fourth hollow line segment has a first narrowed hollow area communicated with the fourth hollow line segment, and the area on the sixth hollow line segment corresponding to the fifth hollow line segment has a second narrowed hollow area communicated with the fifth hollow line segment;

alternatively, the etching pattern comprises: a plurality of fourth patterns; the fourth patterns comprise: two sub-patterns which are symmetrically spaced from each other and in which the axis of symmetry is provided in the radial direction of the filtering cable; and the sub-patterns of the fourth pattern comprise a seventh hollow line segment and an eighth hollow line segment provided side by side in the radial direction of the filtering cable; both ends of the seventh hollow line segment are provided with a first single-ring hollow pattern, respectively; the middle of the side of the first single-ring hollow pattern away from the seventh hollow line segment is provided with a non-hollow area; both ends of the eighth hollow line segment are provided with a second single-ring hollow pattern, respectively; the middle of the side of the second single-ring hollow pattern away from the eighth hollow line segment is provided with a non-hollow area; the area surrounded by the second single-ring hollow pattern is larger than the area surrounded by the first single-ring hollow pattern;

alternatively, the etching pattern comprises: a plurality of fifth patterns; the fifth patterns comprise: a ninth hollow line segment and a tenth hollow line segment that are provided crosswise; the ninth hollow line segment is provided in the axial direction of the filtering cable and is provided with a first widened hollow area at both ends; the tenth hollow line segment is provided in the radial direction of the filtering cable and is provided with a second widened hollow area at both ends; an area surrounded by the second widened hollow area is larger than the area surrounded by the first widened hollow area;

alternatively, the etching pattern comprises: a plurality of sixth patterns; the sixth patterns comprise: a first U-shaped hollow pattern, a second U-shaped hollow pattern, and a third U-shaped hollow pattern that are sequentially provided; the openings of the first U-shaped hollow pattern, the second U-shaped hollow pattern and the third U-shaped hollow pattern are provided in the radial direction of the filtering cable; wherein the opening direction of the second U-shaped hollow pattern is opposite to the opening direction of the first U-shaped hollow pattern and the third U-shaped hollow pattern; one end of the second U-shaped hollow pattern is communicated with one end of the first U-shaped hollow pattern, and the other end thereof is communicated with one end of the third U-shaped hollow pattern;

alternatively, the etching pattern comprises: a plurality of seventh patterns; the seventh patterns comprise: an eleventh hollow line segment in the radial direction of the filtering cable; both ends of the eleventh hollow line segment are provided with a third widened hollow area, respectively.

9. The filtering cable according to claim 7, wherein if the value of N is 1, and the preset filter circuit comprises a band-stop filter circuit;

the etching pattern comprises: a plurality of eighth patterns; the eighth patterns comprise: a twelfth hollow line segment in the radial direction of the filtering cable; both ends of the twelfth hollow line segment are provided with a third single-ring hollow pattern, respectively; the third single-ring hollow pattern has a non-hollow area on the side close to the twelfth hollow line segment;

alternatively, the etching pattern comprises: a plurality of ninth patterns; the ninth patterns comprise: a thirteenth hollow line segment provided in the radial direction of the filtering cable, a third spiral hollow pattern is provided at one end of the thirteenth hollow line segment, and a fourth spiral hollow pattern is provided at the other end thereof; the third spiral hollow pattern is asymmetrical with the fourth spiral hollow pattern;

alternatively, the etching pattern comprises: a plurality of tenth patterns; the tenth patterns comprise: a fourteenth hollow line segment and a fifteenth hollow line segment spaced side by side in the axial direction of the filtering cable; a sixteenth hollow line segment provided between the fourteenth hollow line segment and the fifteenth hollow line segment in the radial direction of the filtering cable; the middle of the fourteenth hollow line segment is communicated with the middle of the fifteenth hollow line segment through the sixteenth hollow line segment; a third single-ring hollow pattern is provided between the fourteenth hollow line segment and the fifteenth hollow line segment and at both sides of the sixteenth hollow line segment; the middle of the side of the third single-ring hollow pattern close to the sixteenth hollow line segment is provided with a non-hollow area; alternatively, the etching pattern comprises: a plurality of eleventh patterns; the eleventh patterns comprise: a rectangular fourth single-ring hollow pattern; one pair of sides of the fourth single-ring hollow pattern are provided in the radial direction of the filtering cable, and the other pair of sides thereof is provided in the axial direction of the filtering cable; a seventeenth hollow line segment is provided outside the fourth single-ring hollow pattern, and at both ends of and the middle of one pair of sides provided in the axial direction of the filtering cable, respectively; one end of the seventeenth hollow line segment is communicated with the fourth single-ring hollow pattern; two symmetric L-shaped hollow patterns are provided between the two seventeenth hollow line segments; the corner of the L-shaped hollow pattern is close to the fourth single-ring hollow pattern, one side thereof is close to the seventeenth hollow line segment, is provided in the radial direction of the filtering cable, and is communicated with the close seventeenth hollow line segment through the hollow line segment which is provided in the axial direction of the filtering cable, and the other side thereof is close to the fourth single-ring hollow pattern and is provided in the axial direction of the filtering cable; the area of the core wire corresponding to the fourth single-ring hollow pattern is provided with a through-hole in the radial direction of the filtering cable.

10. The filtering cable according to claim 7, wherein if the value of N is 1, and the preset filter circuit comprises a band-pass filter circuit;

the etching pattern comprises: a plurality of twelfth patterns; the twelfth patterns comprise: a first sub-pattern and a second sub-pattern spaced from each other; the first sub-pattern of the twelfth pattern comprises: a fourth U-shaped hollow pattern, a fifth U-shaped hollow pattern and a sixth U-shaped hollow pattern, which are sequentially provided; the openings of the fourth U-shaped hollow pattern, the fifth U-shaped hollow pattern and the sixth U-shaped hollow pattern are provided in the radial direction of the filtering cable; wherein the opening direction of the fifth U-shaped hollow pattern is opposite to the opening direction of the fourth U-shaped hollow pattern and the sixth U-shaped hollow pattern; one end of the fifth U-shaped hollow pattern is communicated with one end of the fourth U-shaped hollow pattern, and the other end thereof is communicated with one end of the sixth U-shaped hollow pattern; the second sub-pattern of the twelfth pattern is a pattern obtained in such a way that the first sub-pattern of the twelfth pattern rotates by 180 degrees in the radial direction of the filtering cable; the area of the core wire corresponding to the interval between the first sub-pattern and the second sub-pattern of the twelfth pattern is provided with a first cut-off area; the first cut-off area is filled with a first dielectric; the boundary of the first sub-pattern and the second sub-pattern of the twelfth pattern corresponding to the core wire is provided with a non-hollow area; the core wires on both sides of the first cut-off region are connected with the defective conductor layer;

alternatively, the etching pattern comprises: a plurality of thirteenth patterns; the thirteenth patterns comprise: a ±-shaped hollow pattern; the first vertical side of the ±-shaped hollow pattern is provided in the radial direction of the filtering cable, the first horizontal side and the second horizontal side are provided in the axial direction of the filtering cable, respectively; the length of the first horizontal side is shorter than the length of the second horizontal side; one end of the second horizontal side is provided with a fifth spiral hollow pattern, and the other end thereof is provided with a sixth spiral hollow pattern completely symmetrical with the fifth spiral hollow pattern; one end of the first horizontal side is provided with a seventh spiral hollow pattern, the seventh spiral hollow pattern is located in the non-hollow area of the fifth spiral hollow pattern, and the other end thereof is provided with an eighth spiral hollow pattern completely symmetrical with the seventh spiral hollow pattern, the eighth spiral hollow pattern is located in the non-hollow area of the sixth spiral hollow pattern, the area of the core wire corresponding to the vertical side is provided with a second cut-off area, and the second cut-off area is filled with a second dielectric;

alternatively, the number of the core wires is 2, the etching pattern comprises: a plurality of fourteenth patterns; the fourteenth patterns comprise: a el-shaped hollow pattern; and the θ-shaped hollow pattern comprises a third horizontal side, a fourth horizontal side and a fifth horizontal side provided in the axial direction of the filtering cable, and a second vertical side and a third vertical side provided in the radial direction of the filtering cable; the fourth horizontal side is located between the third horizontal side and the fifth horizontal side; the middle of the side of the fourth horizontal side close to the third horizontal side is provided with a non-hollow line segment provided in the radial direction of the filtering cable; the fourth horizontal side is further provided with a first L-shaped non-hollow area, a second L-shaped non-hollow area, and a third L-shaped non-hollow area with a long side in the axial direction of the filtering cable; the long side of the first L-shaped non-hollow area is communicated with the non-hollow line segment, and the short side thereof is communicated with the long side of the second L-shaped non-hollow area; the short side of the second L-shaped non-hollow area is communicated with the long side of the third L-shaped non-hollow area; one of the two core wires is located in the non-hollow area between the third horizontal side and the fourth horizontal side and is provided with a third cut-off area, and the other core wire is located in the non-hollow area between the third horizontal side and the fifth horizontal side, and is provided with a fourth cut-off area; the third cut-off area is filled with a third dielectric; and the fourth cut-off area is filled with a fourth dielectric;

alternatively, the etching pattern comprises: a plurality of fifteenth patterns; the fifteenth patterns comprise: a square wave hollow pattern; both ends of the square wave hollow pattern are provided with a fourth widened hollow area in the radial direction of the filtering cable, respectively.

11. The filtering cable according to claim 1, wherein the defective conductor layer is provided in a wound form.

12. The filtering cable according to claim 1, further comprising M shielding layers provided outside the N defective conductor layers and insulated from the N defective conductor layers; wherein the value of M is a positive integer.

* * * * *